(12) United States Patent
Kondo

(10) Patent No.: US 8,985,734 B2
(45) Date of Patent: Mar. 24, 2015

(54) LIQUID JETTING APPARATUS, PIEZOELECTRIC ACTUATOR, AND METHOD FOR PRODUCING THE LIQUID JETTING APPARATUS

(71) Applicant: Hirofumi Kondo, Ama-gun (JP)

(72) Inventor: Hirofumi Kondo, Ama-gun (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 14/010,044

(22) Filed: Aug. 26, 2013

(65) Prior Publication Data

US 2014/0063129 A1 Mar. 6, 2014

(30) Foreign Application Priority Data

Aug. 31, 2012 (JP) ................................. 2012-191112
Aug. 31, 2012 (JP) ................................. 2012-191114

(51) Int. Cl.
| | | |
|---|---|---|
| *B41J 2/015* | (2006.01) | |
| *B41J 2/14* | (2006.01) | |
| *H01L 41/047* | (2006.01) | |
| *B41J 2/16* | (2006.01) | |
| *H01L 41/09* | (2006.01) | |

(52) U.S. Cl.
CPC ........... *B41J 2/14201* (2013.01); *H01L 41/047* (2013.01); *B41J 2/1621* (2013.01); *B41J 2/14233* (2013.01); B41J 2002/14459 (2013.01); B41J 2002/14491 (2013.01); B41J 2202/18 (2013.01); *H01L 41/0475* (2013.01); *H01L 41/0973* (2013.01)

USPC .......................................................... 347/20

(58) Field of Classification Search
None
See application file for complete search history.

(56) References Cited

U.S. PATENT DOCUMENTS

| | | | |
|---|---|---|---|
| 2005/0162483 A1* | 7/2005 | Katayama | ........................ 347/65 |
| 2006/0237229 A1 | 10/2006 | Sugahara | |
| 2007/0220744 A1 | 9/2007 | Kitaoka et al. | |
| 2008/0157460 A1 | 7/2008 | Izuchi et al. | |
| 2008/0236890 A1* | 10/2008 | Sugahara | ........................ 174/9 F |
| 2009/0219347 A1* | 9/2009 | Sugahara | ........................ 347/70 |
| 2012/0067624 A1 | 3/2012 | Kubo et al. | |

FOREIGN PATENT DOCUMENTS

| | | |
|---|---|---|
| JP | 2004356255 A | 12/2004 |
| JP | 3654113 B2 | 6/2005 |
| JP | 200635500 | 2/2006 |
| JP | 2006332615 A | 12/2006 |
| JP | 4506773 B2 | 7/2010 |
| JP | 2012-69548 | 4/2012 |
| WO | WO-2006100790 A1 | 9/2006 |

* cited by examiner

*Primary Examiner* — Matthew Luu
*Assistant Examiner* — Erica Lin
(74) *Attorney, Agent, or Firm* — Frommer Lawrence & Haug LLP

(57) ABSTRACT

A liquid jetting apparatus includes a channel unit in which a liquid channel including a nozzle for jetting a liquid is formed, and a piezoelectric actuator provided on the channel unit and configured to apply jetting energy to the liquid inside the liquid channel. The piezoelectric actuator has a piezoelectric element and a wiring substrate in which a first electrode and a wire electrically connected to the first electrode are formed and which is joined to one surface of the piezoelectric element. The first electrode is configured to make contact with the piezoelectric element.

21 Claims, 17 Drawing Sheets

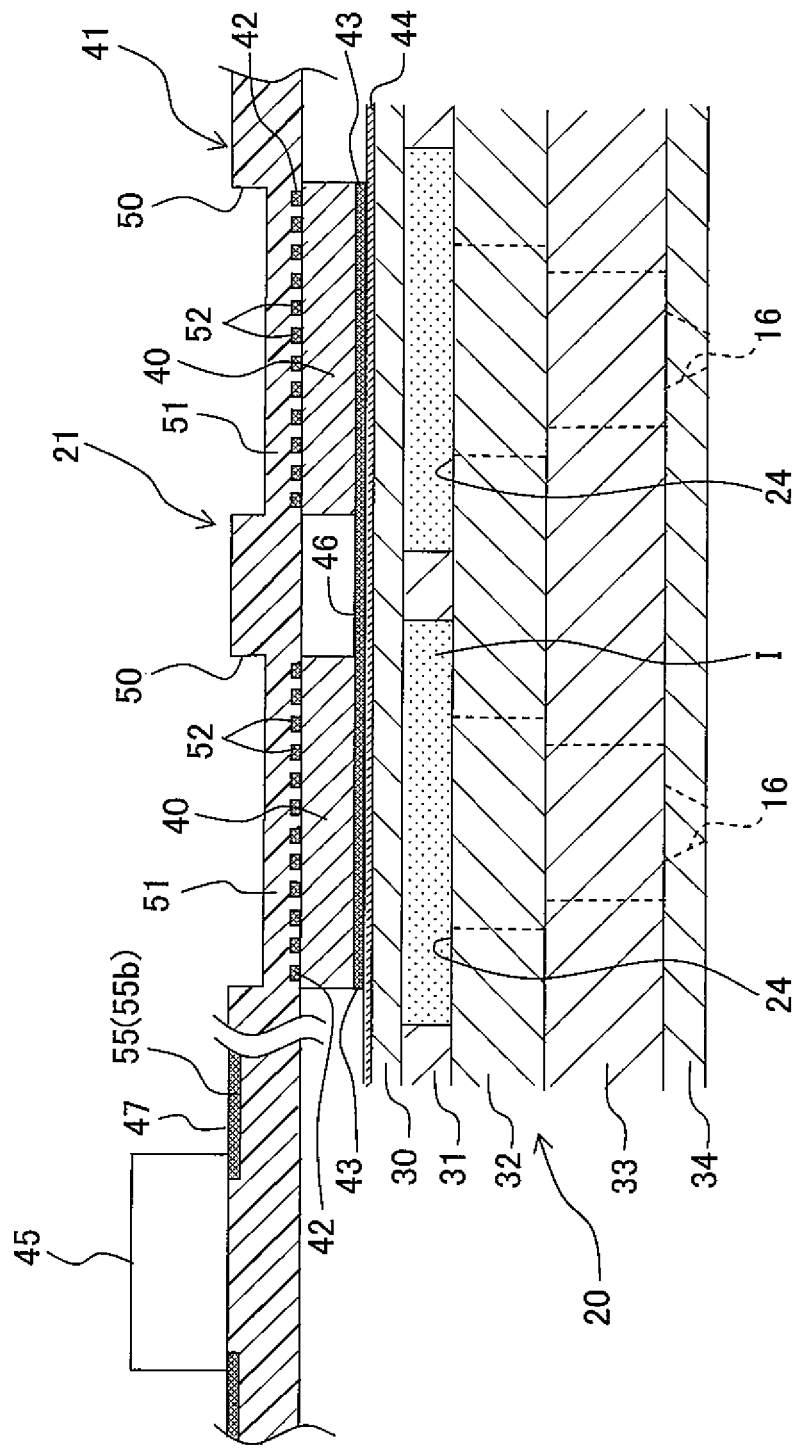

TOP VIEW

BOTTOM VIEW
(JOINT SURFACE SIDE)

TOP VIEW

BOTTOM VIEW
(JOINT SURFACE SIDE)

LIQUID JETTING APPARATUS, PIEZOELECTRIC ACTUATOR, AND METHOD FOR PRODUCING THE LIQUID JETTING APPARATUS

CROSS REFERENCE TO RELATED APPLICATION

The present application claims priority from Japanese Patent Application No. 2012-191112, filed on Aug. 31, 2012 and Japanese Patent Application No. 2012-191114, filed on Aug. 31, 2012, the disclosure of which are incorporated herein by reference in its entirety.

BACKGROUND OF THE INVENTION

1. Field of the Invention

The present invention relates to a liquid jetting apparatus, a piezoelectric actuator, and a method for producing the liquid jetting apparatus.

2. Description of the Related Art

Conventionally, as a configuration of piezoelectric actuators used for various purposes, there has been known such configuration in which a wiring substrate is connected to a surface electrode of a piezoelectric element to supply a signal for driving the piezoelectric element.

Conventionally, there have been known piezoelectric actuators provided for an ink-jet head to jet liquid droplets. Such ink-jet head is provided with a channel unit (channel structure) in which ink channels including a plurality of nozzles are formed, and a piezoelectric actuator provided for the channel unit. Further, the piezoelectric actuator has a piezoelectric layer, and a plurality of individual electrodes formed on a surface of the piezoelectric layer to correspond to the plurality of nozzles, respectively.

A flexible wiring substrate (COF) is connected to the plurality of individual electrodes of the above piezoelectric actuator. A driver IC is mounted on the wiring substrate, and a plurality of wires connected with the driver IC are formed in the wiring substrate. Further, the wiring substrate is provided with a plurality of contact points (substrate-side contact points) corresponding to the plurality of individual electrodes respectively, and these plurality of contact points are connected to the driver IC via the aforementioned wires. Then, the plurality of individual electrodes on the surface of the piezoelectric layer are connected to the plurality of contact points of the wiring substrate, respectively, by bumps of conductive resin including a metallic material and a thermosetting resin. By virtue of this, a drive voltage is applied to each of the plurality of individual electrodes from the driver IC mounted on the wiring substrate.

In a conventional piezoelectric actuator, the electrodes (the individual electrodes) are formed on the surface of the piezoelectric layer, the contact points (the substrate-side contact points) are formed on the wiring substrate, and it is configured such that the individual electrodes of the piezoelectric layer and the contact points of the wiring substrate are connected by the bumps of conductive resin. Therefore, the connection structure between the wiring substrate and the piezoelectric layer (piezoelectric element) is complicated. Further, it is necessary to not only form the electrodes on the piezoelectric layer but also form the contact points on the wiring substrate. This accordingly increases the number of production processes, thereby suffering disadvantage in terms of cost.

SUMMARY OF THE INVENTION

An object of the present invention is to simplify the connection structure between the piezoelectric element and the wiring substrate.

According to a first aspect of the present invention, there is provided a liquid jetting apparatus for jetting a liquid, the apparatus including: a channel unit in which a liquid channel including a nozzle for jetting the liquid is formed; and a piezoelectric actuator which is provided on the channel unit and which applies jetting energy to the liquid inside the liquid channel, wherein the piezoelectric actuator includes: a piezoelectric element; and a wiring substrate in which a first electrode and a wire electrically connected to the first electrode are formed and which is joined to one surface of the piezoelectric element, and wherein the first electrode makes contact with the piezoelectric element.

According to the liquid jetting apparatus of the first aspect of the present invention, the first electrode is formed on the wiring substrate joined to the piezoelectric element, and the first electrode is in contact with the piezoelectric element. That is, because it is configured to connect the piezoelectric element with the wiring substrate via the first electrode alone, the connection structure is simplified between the piezoelectric element and the wiring substrate. Further, since it is not necessary to form any electrode on the piezoelectric element and form any contact point on the wiring substrate as in the conventional manner, it is also possible to simplify the production process.

According to a second aspect of the present invention, there is provided a piezoelectric actuator including: a piezoelectric element; and a wiring substrate in which a first electrode and a wire electrically connected to the first electrode are formed and which is joined to one surface of the piezoelectric element, wherein the first electrode makes contact with the piezoelectric element.

According to a third aspect of the present invention, there is provided a method for producing a liquid jetting apparatus including: a channel unit in which a liquid channel including a nozzle for jetting the liquid is formed; and a piezoelectric actuator which includes a piezoelectric element and a wiring substrate joined to one surface of the piezoelectric element, and which is provided on the channel unit to apply jetting energy to the liquid inside the liquid channel, the method including: a groove formation step for forming a plurality of first grooves on a joint surface of the wiring substrate with respect to the piezoelectric element; and an electrode formation step for forming a first electrode on the joint surface and joining the joint surface of the wiring substrate to the piezoelectric element by filling the first grooves with a liquid conductive material.

In the liquid jetting apparatus obtained according to the production method of the third aspect of the present invention, because the first electrode formed on the wiring substrate is in contact with the piezoelectric element, the connection structure is simplified between the piezoelectric element and the wiring substrate. Further, since it is not necessary to form any electrode on the piezoelectric element and form any contact point on the wiring substrate as in the conventional manner, the production process is also simplified. Further, by using the permeation action by the capillary force to fill the plurality of first grooves with the liquid conductive material after forming the plurality of first grooves in the joint surface of the wiring substrate with the piezoelectric element, it is possible to form the first electrode in a simple manner. Further, the first electrode formed in this manner has a high adhesion and thus is less liable to detachment from the wiring substrate, because its contact area with the wiring substrate becomes larger, compared with the case of forming the same in a flat surface by a printing method or the like.

BRIEF DESCRIPTION OF THE DRAWINGS

FIG. 5 is a cross-sectional view along the line V-V in FIG. 3.

FIGS. 6A and 6B are partial enlarged plan views of a wiring substrate, wherein FIG. 6A is a top view, and FIG. 6B is a bottom view.

FIGS. 13A and 13B are partial enlarged plan views of a wiring substrate according to the second embodiment, wherein FIG. 13A is a top view, and FIG. 13B is a bottom view.

DESCRIPTION OF THE PREFERRED EMBODIMENTS

Figure 1:
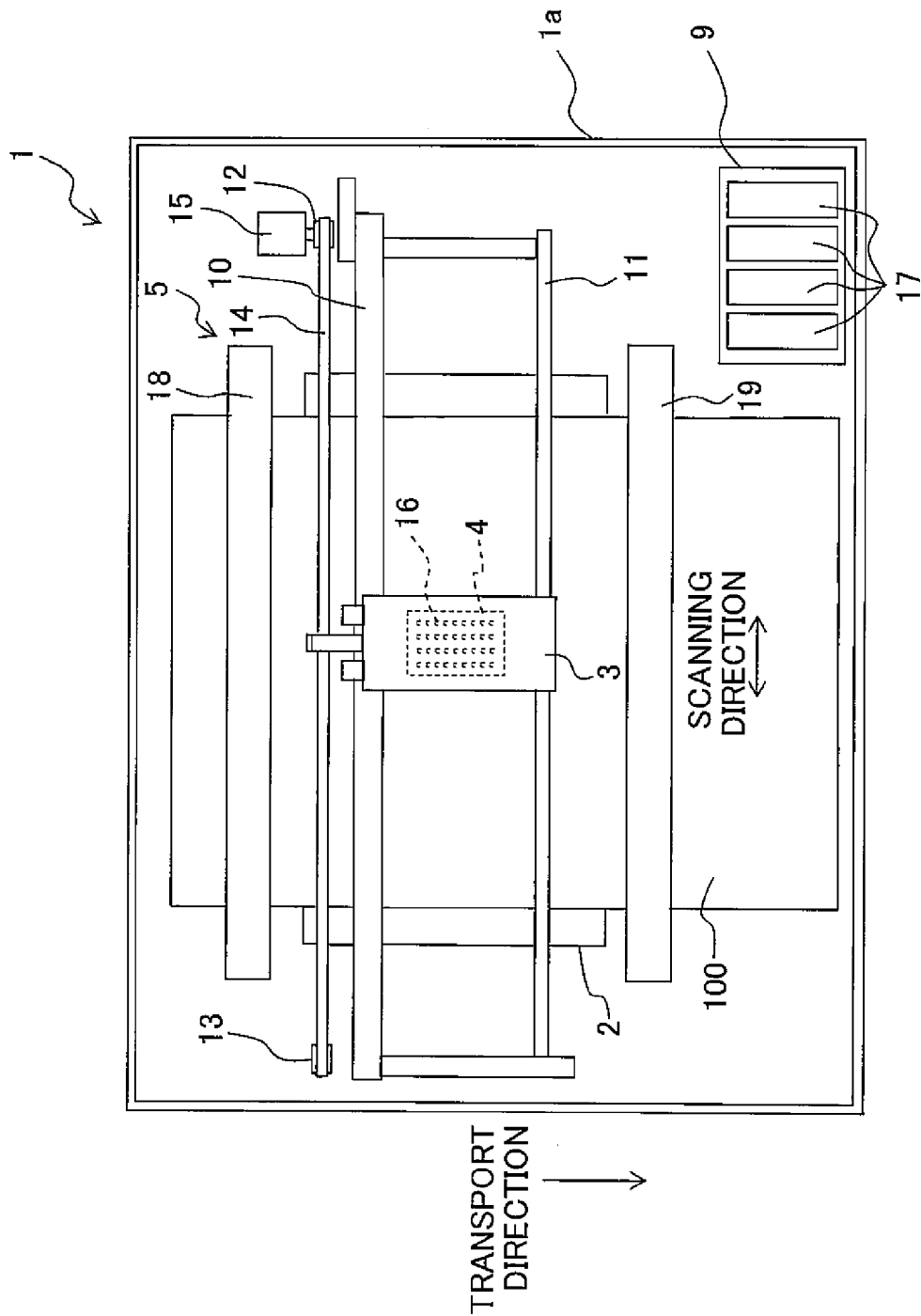
FIG. 1 is a schematic plan view of an ink jet printer of a first embodiment of the present invention.

Next, a first embodiment of the present invention will be explained. First, referring to FIG. 1, a schematic construction of an ink jet printer 1 will be explained. Further, in the following explanations, the front side of the page of FIG. 1 is defined to be the upper side while the back side of the page is defined to be the lower side, and the directional terms "upper" and "lower" are used as appropriate. As shown in FIG. 1, the ink jet printer 1 includes a platen 2, a carriage 3, an inkjet head 4, a transport mechanism 5, etc.

A sheet of recording paper 100, which is a recording medium, is placed on the upper surface of the platen 2. Further, above the platen 2, two guide rails 10 and 11 are provided to extend parallel to a left-right direction (a scanning direction) of FIG. 1. The carriage 3 is configured to be movable reciprocatingly in the scanning direction along the two guide rails 10 and 11 in an area facing the platen 2. Further, the carriage 3 is connected to an endless belt 14 wound around two pulleys 12 and 13. When a carriage drive motor 15 drives the endless belt 14 to put the endless belt 14 into motion, the carriage 3 moves in the scanning direction along with the motion of the endless belt 14.

The ink-jet head 4 (a liquid jetting apparatus) is installed on the carriage 3, and moves along with the carriage 3 in the scanning direction. A plurality of nozzles 16 are formed on the lower surface of the ink jet head 4 (the surface on the back side of the page of FIG. 1). Further, as shown in FIG. 1, a holder 9 is provided in a printer main body 1a of the ink jet printer 1. Four ink cartridges 17 containing four color inks (black, yellow, cyan and magenta), respectively, are installed in the holder 9. The ink jet head 4 mounted on the carriage 3 is connected to the holder 9 through four tubes (not shown). The four color inks in the four ink cartridges 17 are supplied respectively to the ink jet head 4 through the four tubes. The ink jet head 4 causes the plurality of nozzles 16 to jet the inks supplied from the ink cartridges 17 to the recording paper 100 placed on the platen 2.

The transport mechanism 5 has two transport rollers 18 and 19 arranged to interpose the platen 2 in a transport direction, and these two transport rollers 18 and 19 are driven to rotate by an unshown motor. The transport mechanism 5 causes the two transport rollers 18 and 19 to transport the recording paper 100 placed on the platen 2 in the transport direction.

The ink jet printer 1 causes the inks to be jetted from the ink-jet head 4 moving reciprocatingly along with the carriage 3 in the scanning direction (the left-right direction of FIG. 1) to the recording paper 100 placed on the platen 2. At the same time, the two transport rollers 18 and 19 transport the recording paper 100 in the transport direction (downward in FIG. 1). By the above operation, images, characters and the like are recorded on the recording paper 100.

Figure 2:
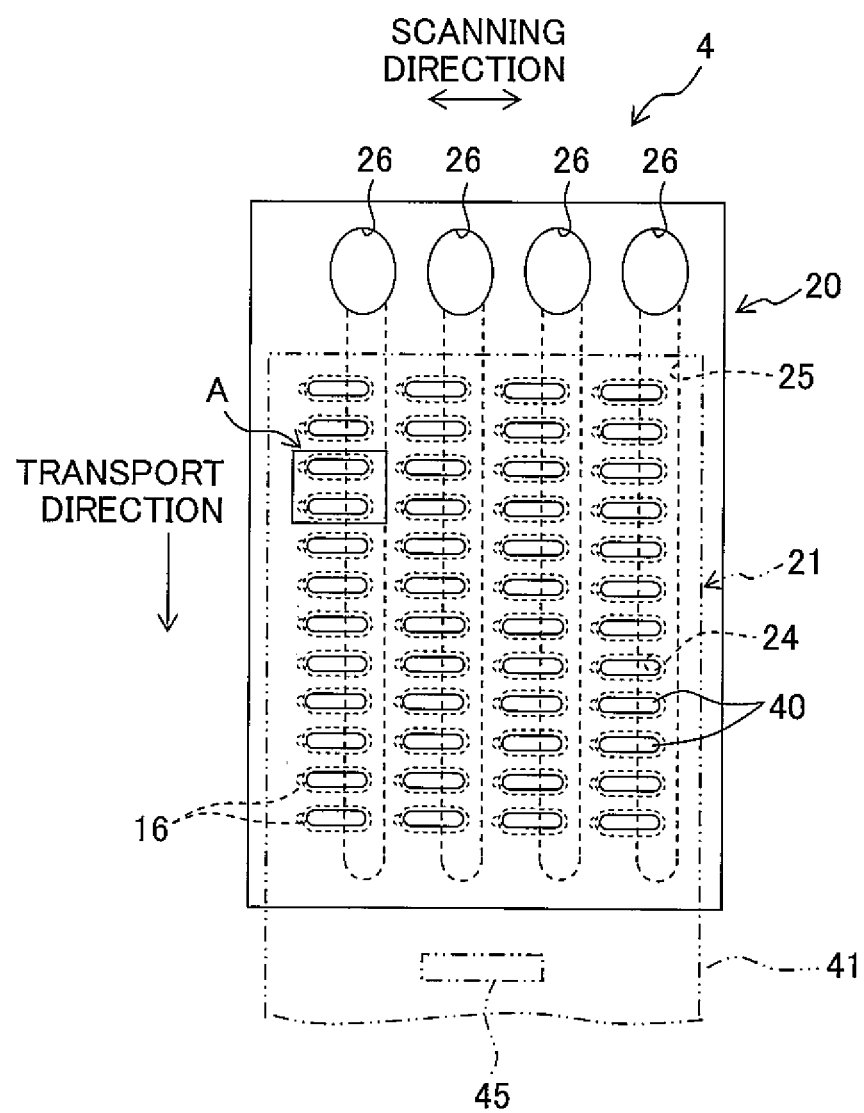
FIG. 2 is a plan view of an ink-jet head of the ink jet printer.
Figure 3:
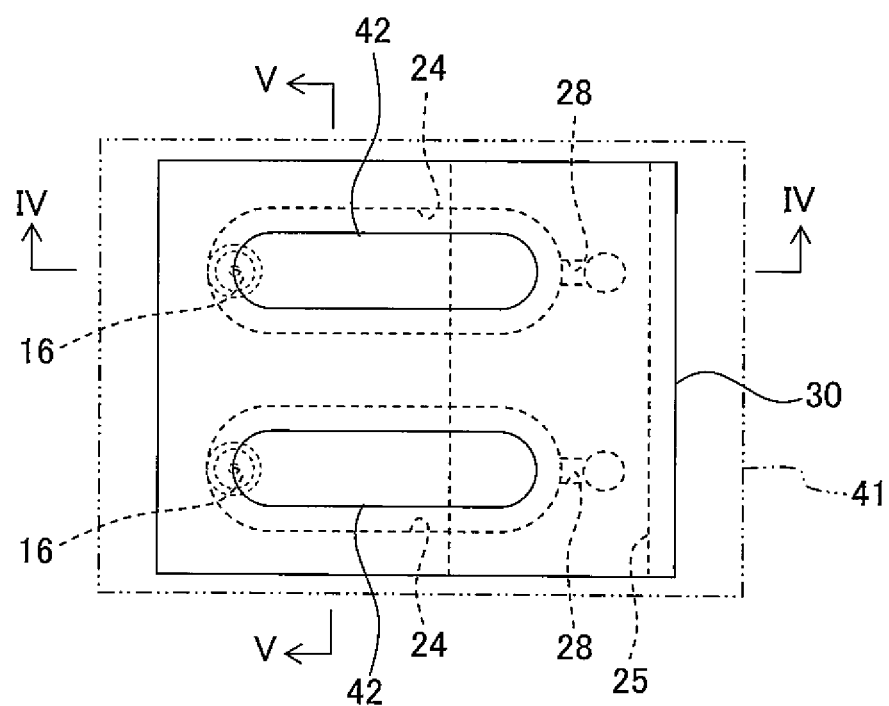
FIG. 3 is an enlarged view of part A in FIG. 2.
Figure 4:
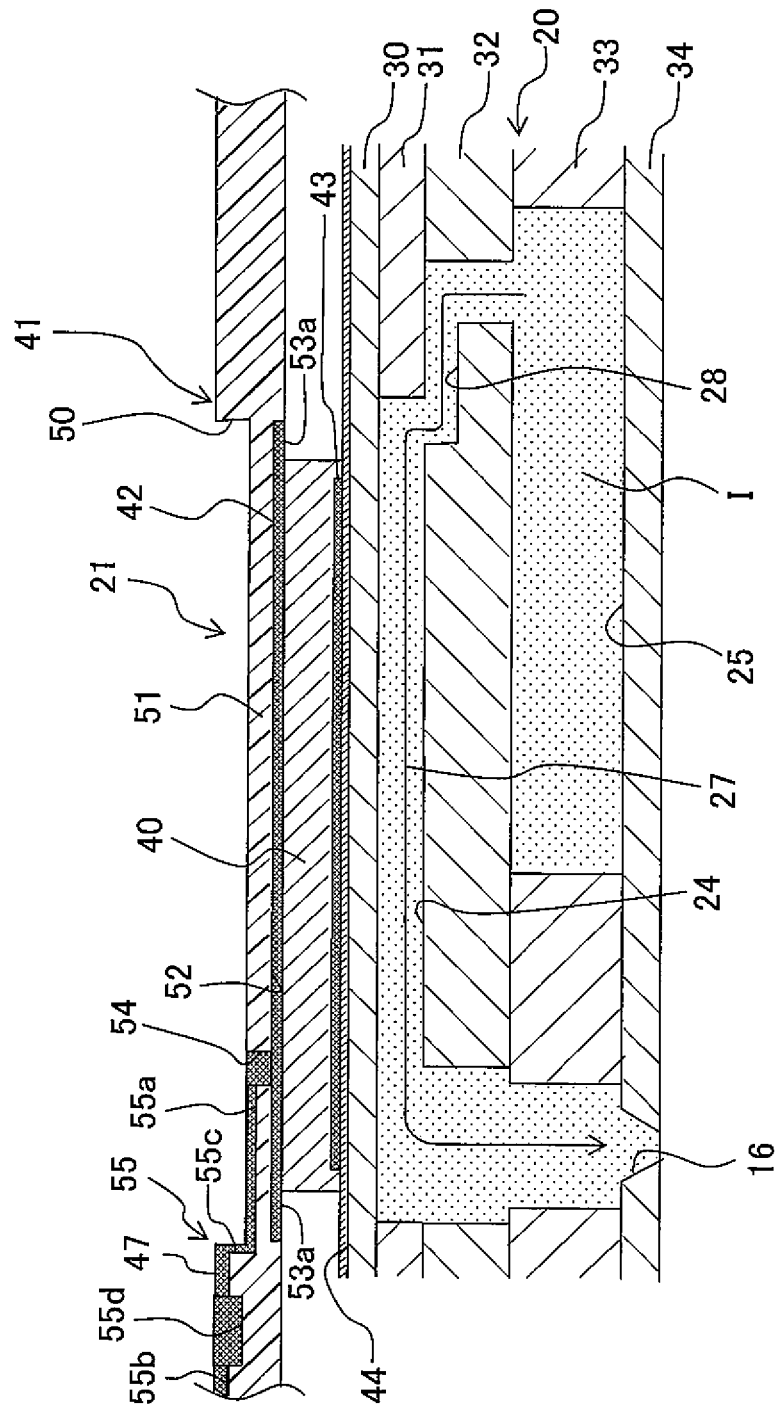
FIG. 4 is a cross-sectional view along the line IV-IV in FIG. 3.

Next, the ink jet head 4 will be explained. Further, in order to simplify the figures, FIGS. 2 and 3 show a COF 50, which is shown by FIGS. 4 and 5 in detail, in a simplified manner with a two-dot chain line. Further, FIG. 5 also shows a driver IC (see FIG. 2), which is not shown in FIG. 3. As shown in FIGS. 2 to 4, the ink jet head 4 includes a channel unit 20, and a piezoelectric actuator 21.

As shown in FIG. 4, the channel unit 20 has a structure of stacking five plates 30 to 34 in which many channel formation holes are formed respectively. By letting the many channel formation holes communicate with each other when these five plates 30 to 34 are stacked, such ink channels are formed in the channel unit 20 as will be described below. While the five plates 30 to 34 are not limited to any particular material, they are formed of a metallic material such as stainless steel, nickel alloy steel, or the like in the first embodiment. Further, in FIGS. 4 and 5, the symbol "I" shows the ink filling the inside of the ink channels.

As shown in FIG. 2, in the upper surface of the channel unit 20 (the upper surface of the vibration plate 30 which is the plate positioned at the uppermost layer), four ink supply holes 26 which are to be connected to the four ink cartridges 17 (see FIG. 1) respectively are formed. Inside the channel unit 20, four manifolds 25 are formed to extend respectively in the transport direction. The four manifolds 25 are connected respectively to the four ink supply holes 26, and supplied with the four color inks (black, yellow, cyan and magenta) contained in the four ink cartridges 17, respectively.

As shown in FIGS. 2 to 5, the channel unit 20 has the plurality of nozzles 16, and a plurality of pressure chambers 24 which are communicated with the plurality of nozzles 16, respectively. The plurality of nozzles 16 are formed on the lower surface (the nozzle plate 34) of the channel unit 20. Each of the plurality of pressure chambers 24 has such a planar shape as is approximately elliptic and long in the scanning direction, and is covered by the vibration plate 30 positioned at the uppermost layer among the five plates 30 to 34. As shown in FIG. 2, the plurality of nozzles 16 and the plurality of pressure chambers 24 are arranged in four rows corresponding to the four manifolds 25, respectively, which are supplied with the four color inks.

As shown in FIG. 4, each of the plurality of pressure chambers 24 communicates with the corresponding manifold 25 via a throttle channel 28 extending in the longitudinal direction of the pressure chamber 24. Further, each of the pressure chambers 24 communicates with one of the nozzles 16. By virtue of this, as shown in FIG. 4, a plurality of individual ink channels 27 are formed in the channel unit 20 to branch from each of the manifolds 25 through the throttle channels 28 and pressure chambers 24 to the nozzles 16.

Next, the piezoelectric actuator 21 will be explained. The piezoelectric actuator 21 is arranged on the upper surface of the vibration plate 30 of the channel unit 20. As shown in FIGS. 2 to 5, the piezoelectric actuator 21 has a plurality of piezoelectric elements 40, and a wiring substrate 41 connected to the plurality of piezoelectric elements 40.

Each of the plurality of piezoelectric elements 40 is made of a piezoelectric material which is composed primarily of ferroelectric lead zirconium titanate (PZT), and is a solid solution of lead titanate and lead zirconate. Each of the plurality of piezoelectric elements 40 has a planar shape of an approximate ellipse which is one-size smaller than the pressure chamber 24. Further, the piezoelectric elements 40 are polarized in their thickness direction. The plurality of piezoelectric elements 40 are arranged in an area of the upper surface of the vibration plate 30 to face the central portions of the plurality of pressure chambers 24, respectively. Further, as is understood from FIG. 5, the plurality of piezoelectric elements 40 are arranged to separate from each other.

While the wiring substrate 41, which will be described later, is joined to the upper surfaces of the respective piezoelectric elements 40 (the surfaces on the opposite side to the vibration plate 30), a first electrode 42 is provided between each of the piezoelectric elements 40 and the wiring substrate 41. That is, the first electrodes 42 are arranged in contact with both the upper surfaces of the piezoelectric elements 40 and the lower surface of the wiring substrate 41. As shown in FIG. 3, each of the first electrodes 42 has a planar shape of an approximate ellipse which is one-size smaller than that of the pressure chambers 24 similar to the piezoelectric elements 40, and is arranged to face the approximately central portion of the corresponding pressure chamber 24. A drive voltage is applied to each of the first electrodes 42 from a driver IC 45 mounted on the wiring substrate 41. The first electrodes 42 will be described later in detail.

A second electrode 43 is arranged on the lower surface of each of the piezoelectric element 40 so that the second electrode 43 faces one of the first electrodes 42 while sandwiching the piezoelectric element 40 between the first electrode 42 and the second electrode 43. As shown in FIGS. 4 and 5, an insulation film 44 made of a synthetic resin material or the like is formed on and across almost the entire upper surface of the metallic vibration plate 30. By this insulation film 44, insulation is secured between the second electrodes 43 of the lower surfaces of the piezoelectric elements 40 and the metallic vibration plate 30. As viewed from above, each of the second electrodes 43 has a planar shape a little smaller than the piezoelectric elements 40. In more detail as shown in FIG. 4, each of the second electrodes 43 is formed to be smaller than the piezoelectric elements 40 with respect to the longitudinal direction of the piezoelectric elements 40 (the extending direction of aftermentioned filling grooves 52), without exposing their lateral portions (the lateral portions on the left and right in FIG. 4) in the longitudinal direction of the piezoelectric elements 40 (that is, the second electrodes 43 do not face such portions of the wiring substrate 41 where the aftermentioned filling grooves 52 extend out from the piezoelectric elements 40). On the other hand, as shown in FIG. 5, each of the second electrodes 43 is almost as long as the piezoelectric elements 40 in a short direction of the piezoelectric elements 40, partially exposing their lateral portions in the short direction of the piezoelectric elements 40 (the lateral portions on the left and right in FIG. 5).

Further, as shown in FIG. 5, the portions of the second electrodes 43 exposed from the piezoelectric elements 40 are connected to a conductive pattern 46 formed on the insulation film 44. Thus, by this conductive pattern 46, the plurality of second electrodes 43 of the piezoelectric elements 40 are electrically conducted to one another. Further, the conductive pattern 46 is electrically connected, by solder or the like, to a ground wire (not shown) formed in the wiring substrate 41. By virtue of the above configuration, the second electrodes 43 of the piezoelectric elements 40 are all constantly maintained at the ground potential.

If the drive voltage is applied from the driver IC 45 to the first electrode 42 of a certain piezoelectric element 40, then a potential difference occurs between this first electrode 42 and the second electrode 43 at the ground potential. Hence, an electric field acts on the piezoelectric element 40 in the thickness direction. Because the direction of the electric field is parallel to the polarization direction of the piezoelectric element 40, the piezoelectric element 40 extends in the thickness direction while contracting in the planar direction. Due to the contraction of the piezoelectric element 40, the vibration plate 30 covering the corresponding pressure chamber 24 bends to be convex toward the pressure chamber 24, thereby causing a decrease in the volume of the pressure chamber 24. At this time, a pressure (jetting energy) is applied to the ink inside the pressure chamber 24, thereby jetting liquid droplets of the ink from the corresponding nozzle 16.

Next, the wiring substrate 41 will be explained. The wiring substrate 41 is a flexible substrate made of a synthetic resin material such as polyimide or the like. The wiring substrate 41 has the driver IC 45, and a plurality of wires 47 connected to the driver IC 45. As shown in FIGS. 2 to 5, the wiring substrate 41 is arranged to cover the plurality of piezoelectric elements 40 of the piezoelectric actuator 21, and joined to the upper surfaces of the plurality of piezoelectric elements 40.

The driver IC 45 is connected to an unshown control substrate controlling the operation of the ink jet head 4. Further, the driver IC 45 is connected to the first electrodes 42 of the plurality of piezoelectric elements 40 via the plurality of wires 47, respectively. Based on a command from the control substrate, the driver IC 45 individually applies the drive voltage to the plurality of piezoelectric elements 40 so as to jet the inks from desired nozzles 16.

As described earlier, it is configured that the plurality of first electrodes 42 are provided respectively between the upper surfaces of the plurality of piezoelectric elements 40 and the lower surface of the wiring substrate 41 to be joined to the plurality of piezoelectric elements 40 (hereinbelow, also referred to as joint surface), and thereby only the first electrodes 42 are in contact with both the wiring substrate 41 and the piezoelectric elements 40. This configuration differs from the conventional configuration in which the electrodes formed on the piezoelectric elements 40 are connected to the contact points formed on the wiring substrate 41 via the bumps, and simplifies the connection structure between the piezoelectric elements 40 and wiring substrate 41. Further, since it is not necessary to form the electrodes on the piezoelectric elements, form the contact points on the wiring substrate, and join the electrodes and the contact points thereafter as in the conventional manner, it is also possible to simplify the production process.

Further, as shown in FIGS. 4 and 5, a recess 50 is formed on the upper surface of the wiring substrate 41 at a portion 51 which is to be joined to one of the piezoelectric elements 40

(a portion which is to be in contact with the first electrodes 42), and thus these joint portions 51 are formed to be thinner than the other portions of the wiring substrate 41. In this manner, because the wiring substrate 41 is locally thin at the portions 51 at which the wiring substrate 41 is joined to the piezoelectric elements 40, when the drive voltage is applied, the wiring substrate 41 is less likely to inhibit deformation of the piezoelectric elements 40.

Figure 6A:
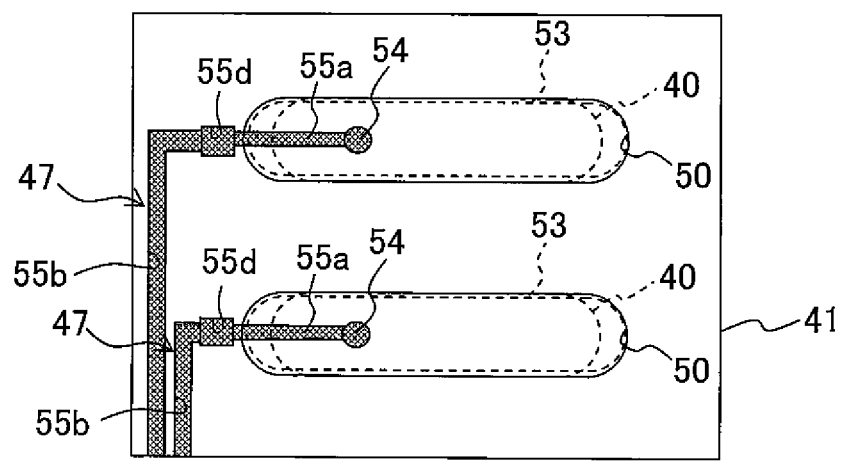
Figure 6B:
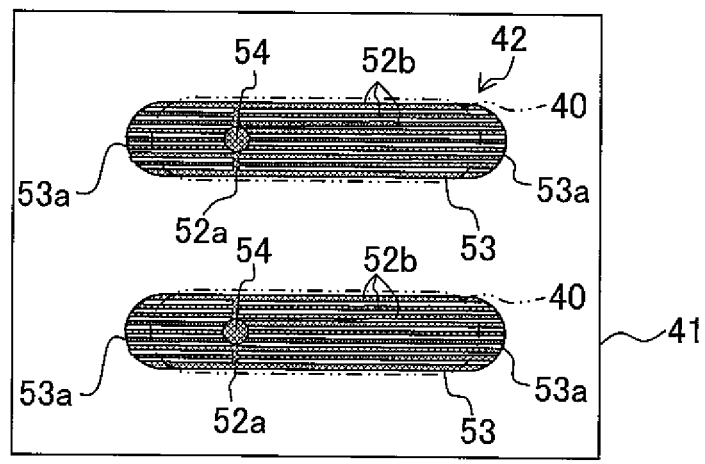

Next, a detailed explanation will be given about a structure of the first electrodes 42 and the wires 47 which are in electrical conduction with the first electrodes 42. In order to make it easy to understand a positional relation between the wiring substrate 41 and the piezoelectric elements 40, FIGS. 6A and 6B show the piezoelectric elements 40 with two-dot chain lines. As shown in FIGS. 4, 5 and 6B, the plurality of filling grooves 52 (an example of first grooves) are formed in each area, of the lower surface (the joint surface) of the wiring substrate 41, facing one of the piezoelectric elements 40. Each of the plurality of filling grooves 52 has a very narrow width as long as a few micrometers (μm) or so. As shown in FIG. 6B, the plurality of filling grooves 52 includes a first filling groove 52a extending in the short direction of the approximately elliptic piezoelectric element 40, and a plurality of second filling grooves 52b each communicating with the first filling groove 52a and extending in the longitudinal direction of the piezoelectric element 40. The first filling groove 52a communicates with a through hole 54 penetrating through the wiring substrate 41 in its thickness direction. As shown in FIG. 6B, the through hole 54 is formed at a position deviated from the center of the piezoelectric element 40 in the longitudinal direction of the piezoelectric element 40. Further, as shown in FIGS. 4, 6A and 6B, each area 53, of the lower surface of the wiring substrate 41, formed with the filling grooves 52 extends out beyond the corresponding piezoelectric element 40 on both sides in its longitudinal direction. Then, the plurality of second filling grooves 52b extend respectively from the first filling groove 52a, which is the communication portion with the through hole 54, toward portions 53a, of the wiring substrate 41, which extend out from the piezoelectric element 40.

As shown in FIGS. 4, 6A and 6B, a plurality of supply grooves 55 are formed on the upper surface of the wiring substrate 41 (the surface on a side opposite to the joint surface with the piezoelectric elements 40) to correspond to the plurality of piezoelectric elements 40 respectively. The supply groove 55 (an example of second groove) corresponding to any one of the piezoelectric elements 40 includes a first supply groove 55a formed on the bottom surface of the recess 50, and a second supply groove 55b formed on an area of the wiring substrate 41 at which the recess 50 is not formed. The first supply groove 55a communicates with the aforementioned through hole 54. The second supply groove 55b communicates with the first supply groove 55a via a vertical groove 55c formed on a lateral side of the recess 50. The second supply groove 55b extends on the upper surface of the wiring substrate 41 from the communication portion with the vertical groove 55c to the area at which the driver IC 45 is placed. Further, in the end portion of the second supply groove 55b on the side of the piezoelectric element 40 (the vertical groove 55c), a liquid receiving portion 55d is formed with a locally greater groove width (and groove depth). Further, each of the first supply groove 55a, the second supply groove 55b, the liquid receiving portion 55d and the vertical groove 55c constituting one of the supply grooves 55 has a considerably greater groove width and groove depth (i.e., a greater sectional area of the groove orthogonal to the length direction), compared with the aforementioned filling groove 52 in communication with the supply groove 55. For example, the groove width of the aforementioned filling groove 52 is a few micrometers (μm), whereas the groove width of the second supply groove 55b is tens of micrometers (μm).

With the wiring substrate 41 having the above configuration of grooves, if a liquid conductive ink (conductive material) is supplied to each of the supply grooves 55, due to the action of capillary force, the conductive ink flows from each of the supply grooves 55 into the plurality of filling grooves 52 having smaller groove width (groove sectional area) than the supply grooves 55. Further, if the sectional area of the filling grooves 52 is smaller, a greater capillary force acts on the conductive ink, thereby making it easier for the conductive ink to permeate the filling grooves 52. In this manner, by filling the plurality of filling grooves 52 and supply grooves 55 with the conductive ink, there are formed the first electrodes 42, and the wires 47 in respective conduction with the first electrodes 42. Further, in FIGS. 4, 5, 6A and 6B, the state of filling the filling grooves 52 and supply grooves 55 with the conductive material (conductive ink) is indicated by hatching those grooves.

Figure 7A:
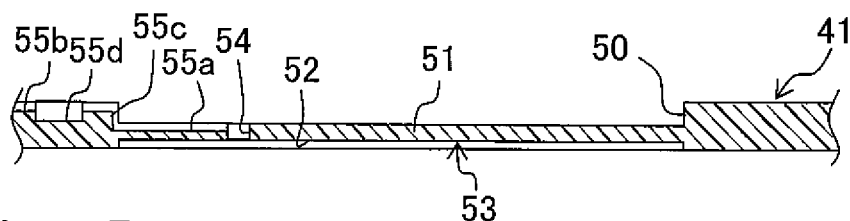
FIGS. 7A to 7C are explanatory views for a process of forming first electrodes.

Hereinbelow, referring to FIGS. 7A to 7C, a specific method will be explained for forming the first electrodes 42 described above.

<Groove Formation Process>

First, press working, laser processing, or the like is carried out to form the plurality of recesses 50 at the portions 51 of the wiring substrate 41 to be joined to the plurality of piezoelectric elements 40 respectively. Then, for each of the portions 51 of the wiring substrate 41, as shown in FIG. 7A, the plurality of filling grooves 52 (first filling grooves 52a and second filling grooves 52b) are formed on the lower surface of the wiring substrate 41 at the portion 51 to be joined to one of the piezoelectric elements 40. Here, each of the areas 53, of the wiring substrate 41, at which the plurality of filling grooves 52 are formed is made to be greater than the upper surface of the corresponding piezoelectric element 40 in its longitudinal direction. Further, the through hole 54 is formed in the wiring substrate 41 to communicate with the first filling grooves 52a. Further, the supply groove 55 (first supply groove 55a, second supply groove 55b, vertical groove 55c, and liquid receiving portion 55d) is formed on the surface of the wiring substrate 41 on the side opposite to the joint surface with the piezoelectric elements 40. Further, it is possible to form these grooves by laser processing.

<Electrode Formation Process>

Figure 7B:
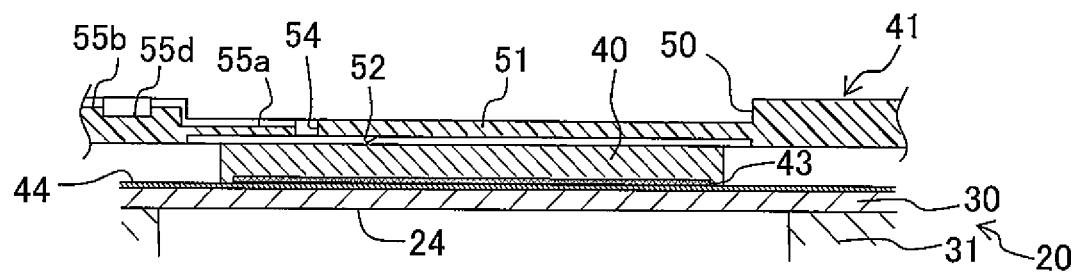

Next, as shown in FIG. 7B, the wiring substrate 41 is arranged on the plurality of piezoelectric elements 40 so that the wiring substrate 40 makes contact with the upper surfaces of the plurality of piezoelectric elements 40. Here, the wiring substrate 41 is arranged such that each of the areas 53 of the wiring substrate 41, at which the plurality of filling grooves 52 are formed, may extend out beyond the piezoelectric element 40 on both sides in the longitudinal direction. Further, the wiring substrate 41 is maintained in the state of making contact with the plurality of piezoelectric elements 40 not to be out of alignment with respect to the plurality of piezoelectric elements 40, by pressing the wiring substrate 41 from above, or by using an adhesive or another appropriate fixation means to temporarily fix the wiring substrate 41, etc.

Figure 7C:
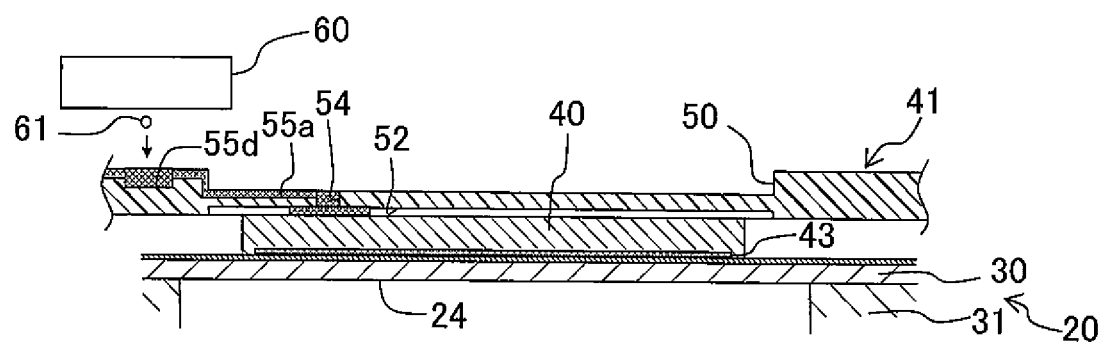

Next, as shown in FIG. 7C, an inkjet head 60 for jetting a conductive ink 61 is placed above the wiring substrate 41. Then, the conductive ink 61 is jetted from the ink jet head 60 to the liquid receiving portion 55d of the supply groove 55 corresponding to each of the piezoelectric elements 40. As the conductive ink, compounds of a thermosetting resin, such as unsaturated polyester resin, two-component polyolefin resin, epoxy resin, etc., and particles of a metal such as Ag or the like can be adopted. Due to the permeation action by the capillary force, the conductive ink 61 supplied to the liquid receiving portion 55*d* flows from the first supply groove 55*a* into the plurality of filling grooves 52 having small groove widths (groove sectional areas) via the through hole 54. Further, the plurality of filling grooves 52 are open to the atmosphere in the portions extending out from the piezoelectric elements 40. By virtue of this, the plurality of filling grooves 52 are filled throughout with the conductive ink 61 to form the first electrode 42 between the wiring substrate 41 and the piezoelectric element 40. Further, by filling not only the first supply groove 55*a* but also the second supply groove 55*b* with the conductive ink 61, the wire 47 is formed on the upper surface of the wiring substrate 41 to connect the first electrode 42 and the driver IC 45. Thereafter, by hardening the infilled conductive ink, the wiring substrate 41 is joined to the plurality of piezoelectric elements 40. For example, if the conductive ink 61 composed primarily of a thermosetting resin is used, a heating process is carried out after filling the filling grooves 52 and the supply groove 55 with the conductive ink 61.

In this manner, according to the first embodiment, by making use of the permeation action by the capillary force to fill the plurality of filling grooves 52 formed in the wiring substrate 41 with the liquid conductive ink 61, it is possible to simply form the first electrodes 42 in contact with both the wiring substrate 41 and the piezoelectric elements 40. Further, there is also such an advantage that the first electrodes 42 formed by filling the plurality of filling grooves 52 with the conductive ink 61, have a high adhesion and thus are less liable to be detached from the piezoelectric elements 40, because the electrode material has a greater contact area with the wiring substrate 41 compared with the case of forming the same in a flat surface with little asperity or irregularity by a printing method or the like.

Further, as shown in FIG. 7C, after arranging the wiring substrate 41 so that the wiring substrate 41 makes contact with the piezoelectric elements 40 to form minute interspaces between the filling grooves 52 of the wiring substrate 41 and the upper surfaces of the piezoelectric elements 40, these interspaces are filled with the conductive ink 61. In this case, compared with the state in which the filling grooves 52 are open before the wiring substrate 41 makes contact with the piezoelectric elements 40, greater capillary force acts on the conductive ink 61. Therefore it becomes easier to fill the plurality of filling grooves 52 throughout with the conductive ink 61. Further, by hardening the liquid conductive ink 61 which remains in the state of making contact with both the wiring substrate 41 and the piezoelectric elements 40, the formed first electrodes 42 also have a high adhesion to the piezoelectric elements 40. Therefore, compared with such a case as attaching the wiring substrate 41 formed with the first electrodes 42 to the piezoelectric elements 40, the first electrodes 42 are less liable to be detached from the piezoelectric elements 40.

Further, as shown in FIGS. 4, 6A and 6B, parts of the areas 53, at which the plurality of filling grooves 52 of the wiring substrate 41 are formed, extend out from the piezoelectric elements 40 on both sides in the longitudinal direction, and these extending-out portions 53*a* are not joined to the upper surface of the piezoelectric element 40. That is, at the extending-out portions 53*a*, the plurality of filling grooves 52 are open to the atmosphere. Therefore, when the conductive ink 61 is supplied from the supply groove 55 to the plurality of filling grooves 52, the air inside the plurality of filling grooves 52 is let out from the above extending-out portions 53*a* to the outside. Therefore, it becomes possible to fill the plurality of filling grooves 52 throughout with the conductive material. Further, the plurality of filling grooves 52 extend from the communication portion with the through hole 54 on the side of the supply groove 55 toward the portions 53*a* extending out from the piezoelectric element 40. Therefore, the conductive ink 61, which has flowed into the plurality of filling grooves 52 from the supply groove 55, flows toward the portions 53*a* extending out from the piezoelectric element 40, that is, the portions of the filling grooves 52 in communication with the atmosphere. Hence, it becomes even easier for the air to move out of the filling grooves 52.

However, if parts of the areas 53, at which the plurality of filling grooves 52 of the wiring substrate 41 are formed, extend out from the piezoelectric elements 40, it is conceivable that the conductive ink 61 drips down from these extending-out portions 53*a*. To address this problem, as shown in FIG. 4 in the first embodiment, the insulation film 44 is formed in the area, of the metallic vibration plate 30 of the channel unit 20, facing the extending-out portions 53*a* extending out of the piezoelectric elements 40. Therefore, even if the conductive ink 61 drips down from the extending-out portions 53*a*, short circuit is still reliably prevented between the first electrodes 42 and the metallic vibration plate 30. Further, in each of the piezoelectric elements 40, while the second electrode 43 facing the first electrode 42 is exposed at lateral portions in the latitudinal direction of the piezoelectric element 40 (see FIG. 5), as shown in FIG. 4, the second electrode 43 is not exposed at lateral portions in the longitudinal direction of the piezoelectric element 40 (the lateral portions on the sides at which the filling grooves 52 extend out from the piezoelectric element 40). Therefore, even if the conductive ink 61 drips down from the filling grooves 52 along the lateral sides of the piezoelectric elements 40, short circuit is still prevented between the first electrodes 42 and the second electrodes 43.

In the first embodiment, the supply grooves 55 each of which has greater groove width than each of the plurality of filling grooves 52 are formed on the surface of the wiring substrate 41 on the side opposite to the joint surface of the wiring substrate 41. Then, by jetting the conductive ink 61 from the ink jet head 60 toward the supply grooves 55 having greater groove width, the conductive ink 61 permeates the plurality of filling grooves 52 from the supply grooves 55 due to the action of capillary force. By virtue of this, it is easy for the conductive material to fill the plurality of filling grooves 52 having smaller groove width. Further, by also filling the supply grooves 55 with the conductive ink 61, it is possible to form the wires 47 in conduction with the first electrodes 42 at the same time.

Further, because each of the supply grooves 55 includes the liquid receiving portion 55*d* having locally greater groove width, by jetting the conductive ink 61 into these liquid receiving portions 55*d*, it is easy to supply the conductive ink 61 to the supply grooves 55. Further, each of the liquid receiving portions 55*d* is positioned in the end portion of one of the supply groove 55 on a side at which the supply groove 55 communicates with the plurality of filling grooves 52. In this manner, by landing the conductive ink 61 on the end portion of each of the supply grooves 55 near the filling grooves 52, it becomes easy for the conductive ink to permeate the plurality of filling grooves 52 having smaller groove width.

Next, referring to FIGS. 11 to 15E, a second embodiment will be explained. Note that, however, the same reference numerals are used to refer to the components with identical or similar configurations to those of the first embodiment, any explanation for which will be omitted as appropriate.

Figure 12:
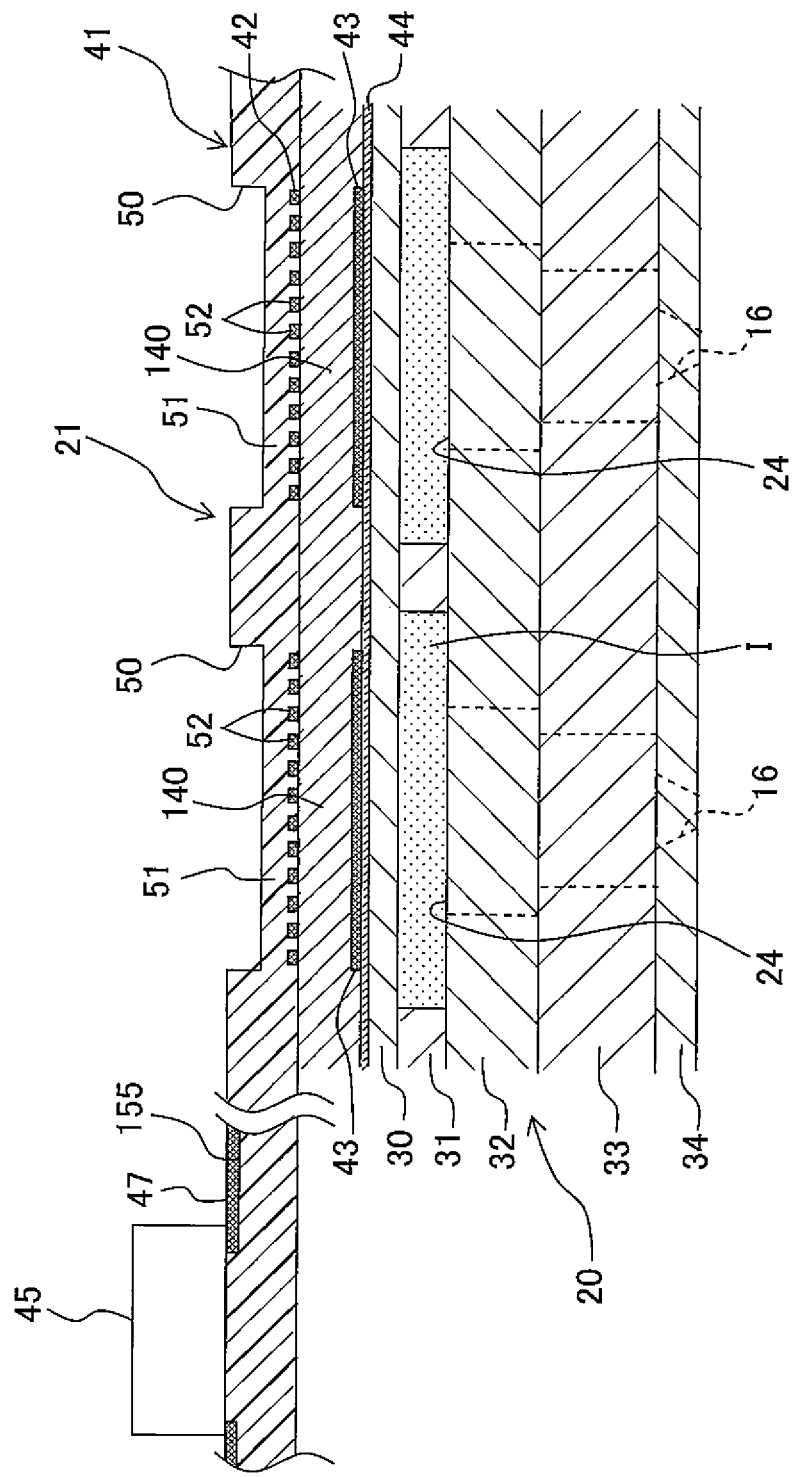
FIG. 12 is a cross-sectional view corresponding to FIG. 5 according to the second embodiment.

In the second embodiment as shown in FIG. 12, a piezoelectric layer 140 is arranged over the upper surface of the vibration plate 30 to commonly cover the plurality of pressure chambers 24. Further, in the second embodiment, the portions of the piezoelectric layer 140 facing the plurality of pressure chambers 24 respectively correspond to the piezoelectric elements of the present invention. Further, each of the second electrodes 43 has a planar shape of an approximate ellipse in the same way as the first electrodes 42.

Figure 11:
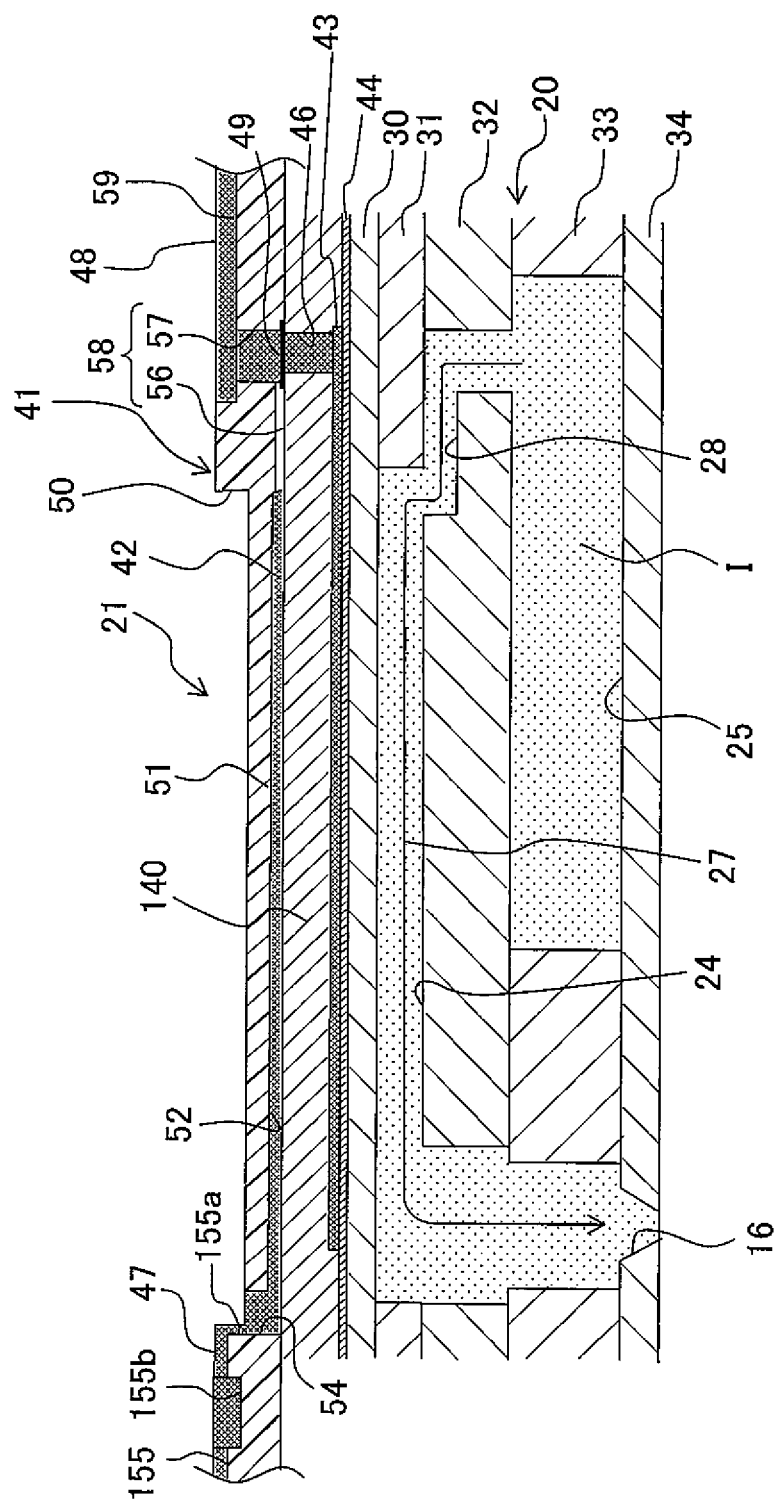
FIG. 11 is a cross-sectional view corresponding to FIG. 4 according to a second embodiment.

As shown in FIG. 11, a through hole 46 is formed in a portion of the piezoelectric layer 140 overlapping with one end portion of each of the second electrodes 43 in the longitudinal direction. Each of the through holes 46 is filled with a conductive material and, further, on the upper surface of the piezoelectric layer 140, pullout electrodes 49 are formed in conduction with the conductive material inside the through holes 46. By virtue of this, the second electrodes 43 formed beneath the lower surface of the piezoelectric layer 140 are configured to be in conduction with the pullout electrodes 49 formed on the upper surface of the piezoelectric layer 140. Further, because each of the pullout electrodes 49 is connected with an aftermentioned ground wire 48 formed on the wiring substrate 41, each of the second electrodes 43 is constantly maintained at the ground potential. It is possible to form the second electrodes 43 and the pullout electrodes 49 in conduction with the second electrodes 43 by a publicly known method such as screen printing, sputtering, or the like.

Next, a detailed explanation will be given about structures of the first electrodes 42, and the wires 47 in conduction with the first electrodes 42.

Figure 13A:
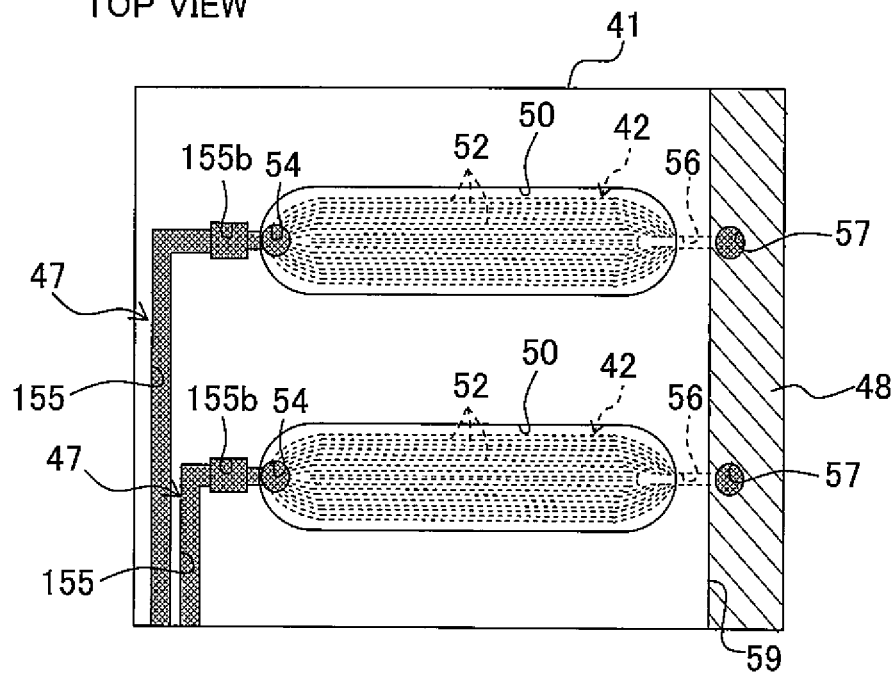
Figure 13B:
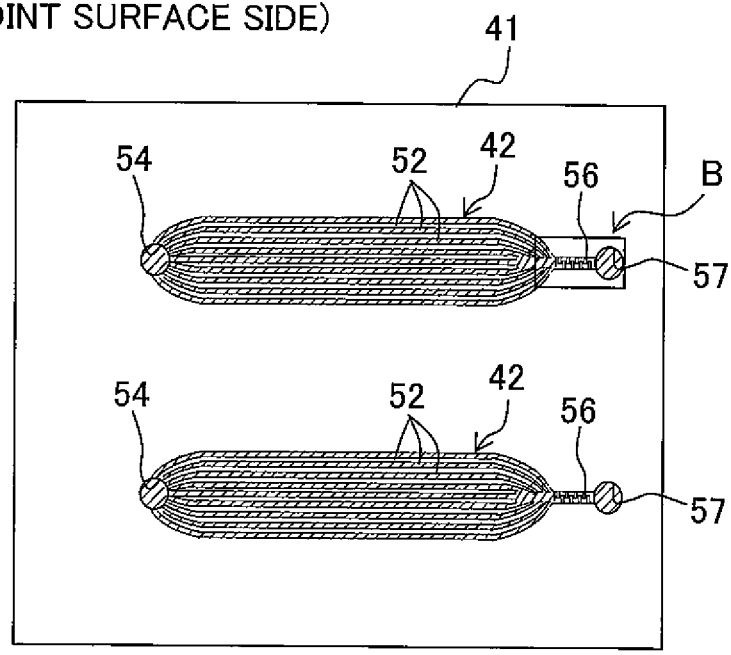

As shown in FIGS. 11, 13A and 13B, for each of portions of the wiring substrate 41 corresponding to the pressure chambers 24 respectively, the plurality of filling grooves 52 are in communication with, at their end portions on one side, the corresponding through hole 54 penetrating through the wiring substrate 41 in the thickness direction. Further, the plurality of supply grooves 155 are formed in the upper surface of the wiring substrate 41 (the surface on the side opposite to the joint surface with the piezoelectric layer 140) to correspond to the plurality of first electrodes 42, respectively. Each of the supply grooves 155 (an example of second groove) corresponding to one of the first electrodes 42 communicates with the corresponding through hole 54 via a vertical groove 155a formed on a lateral side of the recess 50. On the other hand, the supply groove 155 extends on the upper surface of the wiring substrate 41 to the area on which the driver IC 45 is placed. Further, in the vicinity of the end portion of the supply groove 155 on the side of the filling grooves 52, a liquid receiving portion 155b having a locally greater groove width (and groove depth) is formed. Further, compared with the aforementioned filling groove 52, the supply groove 155 (including the liquid receiving portion 155b) has a considerably greater groove width and groove depth (i.e., a greater sectional area of the groove orthogonal to the length direction). For example, the groove width of the aforementioned filling groove 52 is a few micrometers (μm), whereas the groove width of the supply groove 155 is tens of micrometers (μm).

Figure 14:
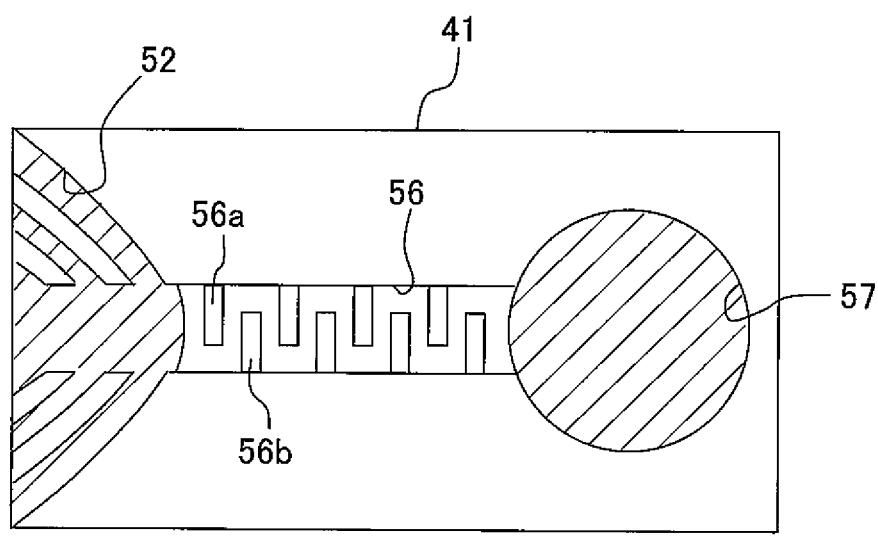
FIG. 14 is an enlarged view of part B in FIG. 13B.

Further, for each of portions of the wiring substrate 41 corresponding to the pressure chambers 24 respectively, the plurality of filling grooves 52 are connected to an atmosphere communication groove 56 formed on the joint surface of the wiring substrate 41 at the end portion on a side opposite to the through hole 54. The atmosphere communication groove 56 extends from the communication portion with the plurality of filling grooves 52 in the longitudinal direction of the pressure chamber 24. As shown in FIG. 14, the atmosphere communication groove 56 has two types of ribs 56a and 56b which project from the lateral sides of the groove in mutually opposite directions. These two types of ribs 56a and 56b are arranged alternately along the length direction of the groove. By virtue of this, the atmosphere communication groove 56 has a complicated internal shape (labyrinth form), thereby increasing the fluid-flow resistance when a fluid passes through the atmosphere communication groove 56.

Further, the atmosphere communication groove 56, and is connected to an atmosphere communication hole 57 penetrating through the wiring substrate 41 in the thickness direction to open to both upper and lower surfaces. By virtue of this, even if the wiring substrate 41 contacts with the upper surface of the piezoelectric layer 140 and the plurality of filling grooves 52 are closed up by the piezoelectric layer 140, the plurality of filling grooves 52 still communicate with the atmosphere via the atmosphere communication groove 56 and atmosphere communication hole 57. That is, in the second embodiment, an atmosphere communication passage 58, through which the plurality of filling grooves 52 communicate with the atmosphere, is constituted by the atmosphere communication groove 56 and atmosphere communication hole 57.

If a liquid conductive ink (conductive material) is supplied to each of the supply grooves 155 in a state that the piezoelectric layer 140 is in contact with the wiring substrate 41 having the above configuration of grooves, the conductive ink flows from each of the supply grooves 155 into the plurality of filling grooves 52 having smaller groove width (groove section area) than the supply grooves 155 due to the action of capillary force. Further, if the sectional area of the filling grooves 52 is smaller, a greater capillary force acts on the conductive ink, thereby making it easier for the conductive ink to permeate the filling grooves 52. Further, because the plurality of filling grooves 52 communicate with the atmosphere communication passage 58, when the filling grooves 52 are filled with the conductive ink 61, the air inside the plurality of filling grooves 52 is let out from the atmosphere communication passage 58 to the outside. In FIGS. 11, 12, 13A and 13B, the state in which the filling grooves 52 and supply grooves 155 are filled with the conductive material (conductive ink) is indicated by hatching those grooves.

In this manner, by filling the plurality of filling grooves 52 on the lower surface of the wiring substrate 41 with the conductive ink 61, the first electrodes 42 are formed between the wiring substrate 41 and the piezoelectric layer 140. Further, by filling the supply grooves 155 on the upper surface of the wiring substrate 41 with the conductive ink 61, the wires 47 in conduction with the first electrodes 42 are formed.

Further, in the second embodiment as shown in FIGS. 11, 13A and 13B, the atmosphere communication passage 58 connected to the plurality of filling grooves 52 is provided in an area of the wiring substrate 41 outside the pressure chambers 24. However, as shown in FIG. 11, the atmosphere communication passage 58 is arranged to overlap with the throttle channel 28 extending from the pressure chamber 24 in its longitudinal direction. Therefore, it is not necessary to widen the intervals for arranging the pressure chambers 24 on the side of the channel unit 20 in order to form the atmosphere communication passages 58 in the wiring substrate 41, and the channel unit 20 does not become large in size either.

Further, although the atmosphere communication passage 58 may also be left as it is after filling the plurality of filling grooves 52 with the conductive ink, in the second embodiment, the atmosphere communication hole 57 (especially the atmosphere communication groove 56 penetrating through the wiring substrate 41) is used for ground connection of the second electrode 43. The atmosphere communication hole 57 vertically penetrating through the wiring substrate 41 is open to both the upper and lower surfaces of the wiring substrate 41. A supply groove 59 connected to the atmosphere communication hole 57 is formed on the upper surface of the wiring substrate 41. Then, by filling the atmosphere communication hole 57 with the conductive material (conductive ink) from the supply groove 59, the conductive material inside the atmosphere communication hole 57 is electrically connected to the pullout electrode 49 of the second electrode 43 pulled out to the one surface of the piezoelectric layer 140. Further, by filling the supply groove 59 with the conductive material, the ground wire 48 is formed on the upper surface of the wiring substrate 41. By using the atmosphere communication hole 57 penetrating through the wiring substrate 41, it is possible to connect the pullout electrode 49 of the second electrode 43 to the ground wire 48 formed on the upper surface of the wiring substrate 41.

Hereinbelow, a specific method will be explained for forming the first electrode 42 described above. FIGS. 15A to 15E are views for explaining a process of forming each of the first electrodes 42.

<Groove Formation Process>

Figure 15A:
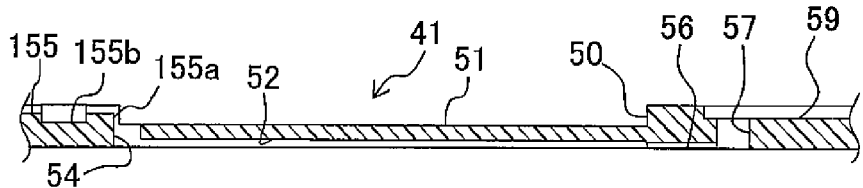
FIGS. 15A to 15E are explanatory views for a process of forming first electrodes of the second embodiment.

First, press working, laser processing, or the like is carried out to form a plurality of recesses 50 at a plurality of portions 51 of the wiring substrate 41 corresponding to the plurality of pressure chambers 24 respectively. Then, for each of the portions 51 of the wiring substrate 41, as shown in FIG. 15A, the plurality of filling grooves 52 are formed on the lower surface of the wiring substrate 41. Further, the through hole 54 is formed in the wiring substrate 41 to communicate with the plurality of filling grooves 52. Further, the supply groove 155 (including the vertical groove 155a and liquid receiving portion 155b) and the supply groove 59 are formed on a surface of the wiring substrate 41 on a side opposite to the joint surface with the piezoelectric layer 140. Further, it is possible to form these grooves by laser processing.

<Atmosphere Communication Passage Formation Process>

As shown in FIG. 15A, the atmosphere communication groove 56 is formed on the lower surface of the wiring substrate 41 to communicate with the plurality of filling grooves 52. Further, the atmosphere communication hole 57 is formed to penetrate through the wiring substrate 41 and to communicate with the atmosphere communication groove 56. In the same way as the above groove formation process, it is possible to form the atmosphere communication groove 56 and atmosphere communication hole 57 by laser processing.

<Electrode Formation Process>

Figure 15B:
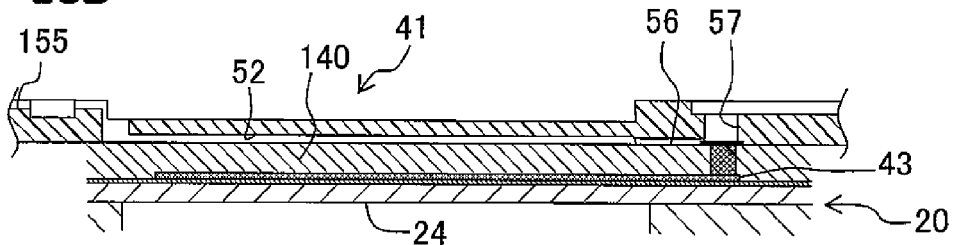

Next, as shown in FIG. 15B, the wiring substrate 41 is arranged to contact with the upper surface of the piezoelectric layer 140. Further, the wiring substrate 41 is maintained in the state of making contact with the piezoelectric layer 140 not to be out of alignment with respect to the piezoelectric layer 140, by pressing the wiring substrate 41 from above, or by using an adhesive or another appropriate fixation means to temporarily fix the wiring substrate 41, etc.

Figure 15C:
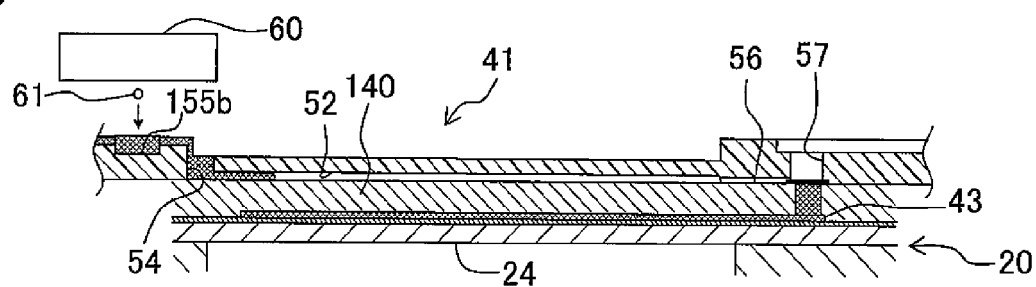

Next, as shown in FIG. 15C, the ink-jet head 60 for jetting the conductive ink 61 is placed above the wiring substrate 41. Then, the conductive ink 61 is jetted from the ink jet head 60 to the liquid receiving portion 155b of the supply groove 155. As the conductive ink, compounds of a thermosetting resin, such as unsaturated polyester resin, two-component polyolefin resin, epoxy resin, etc. and particles of a metal such as Ag or the like can be adopted. Due to the permeation action by the capillary force, the conductive ink 61 supplied to the liquid receiving portion 155b flows from the supply groove 155 into the plurality of filling grooves 52 having small groove widths (groove sectional areas) via the through hole 54, so as to form the first electrode 42 between the wiring substrate 41 and the piezoelectric layer 140. Further, by filling the supply groove 155 with the conductive ink 61, the wire 47 is formed on the upper surface of the wiring substrate 41 to connect the first electrode 42 and the driver IC 45.

Here, since the plurality of filling grooves 52 are in communication with the atmosphere communication groove 56, when the plurality of filling grooves 52 are filled with the conductive ink 61, the air inside the filling grooves 52 moves out from the atmosphere communication groove 56 to the upside via the atmosphere communication hole 57. Therefore, the plurality of filling grooves 52 are filled throughout with the conductive ink 61. Further, as shown in FIG. 14, since the atmosphere communication groove 56 has a complicated labyrinth form with the two types of ribs aligned alternately, even if a part of the conductive ink 61 filling the filling grooves 52 flows out into the atmosphere communication groove 56, the conductive ink 61 will not fill the atmosphere communication groove 56 entirely, thereby preventing the conductive ink 61 from flowing to the outside.

Figure 15D:
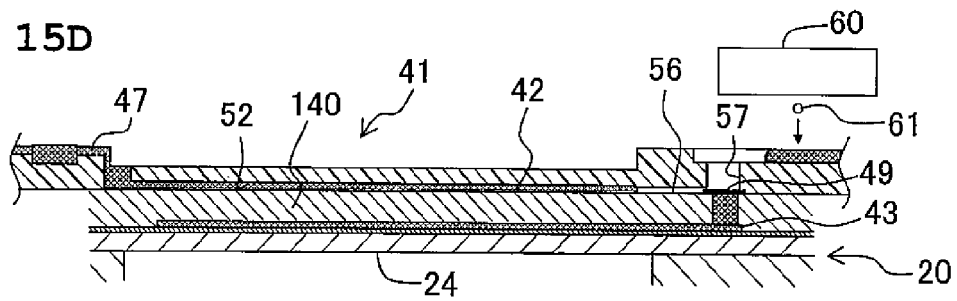
Figure 15E:
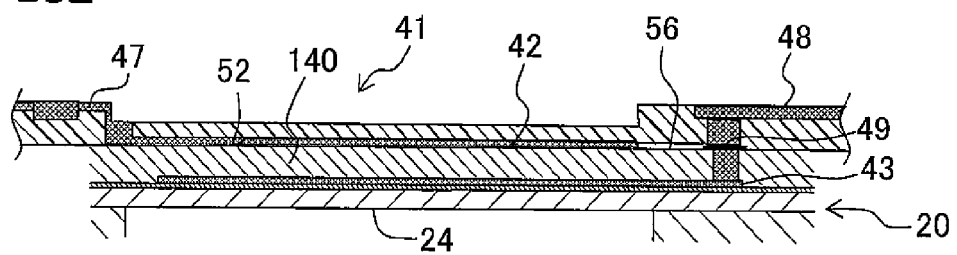

After forming the first electrode 42, as shown in FIG. 15D, the conductive ink 61 is jetted from the ink jet head 60 into the supply groove 59. Then, as shown in FIG. 15E, the atmosphere communication hole 57 is filled with the conductive ink 61 from the supply groove 59, and the conductive ink 61 filled in the atmosphere communication hole 57 makes contact with and is electrically connected to the pullout electrodes 49 formed on the upper surface of the piezoelectric layer 140. Further, by filling the supply groove 59 with the conductive ink 61, the ground wire 48 is formed on the upper surface of the wiring substrate 41. By using the atmosphere communication holes 57, it is possible to connect the pullout electrode 49 of the second electrodes 43 formed on the upper surface of the piezoelectric layer 140 to the ground wire 48 formed on the upper surface of the wiring substrate 41. Further, as described above, because the atmosphere communication groove 56 is formed into the labyrinth form between the atmosphere communication hole 57 and the plurality of filling grooves 52 which form the first electrode 42, the conductive ink 61 filled in the atmosphere communication hole 57 is prevented from reaching the plurality of filling grooves 52 to be conducted with the first electrode 42.

Thereafter, by hardening the infilled conductive ink 61, the wiring substrate 41 is joined to the piezoelectric layer 140. For example, if the conductive ink 61 composed primarily of a thermosetting resin is used, a heating process is carried out after filling the filling grooves 52, the supply groove 155, the atmosphere communication hole 57 and the supply groove 59 with the conductive ink 61.

If the wiring substrate 41 is in contact with the piezoelectric layer 140, the plurality of filling grooves 52 of the wiring substrate 41 are closed up by this piezoelectric layer 140. In the second embodiment, however, the atmosphere communication passage 58, through which the plurality of filling grooves 52 communicate with the atmosphere, is formed in the wiring substrate 41 to let. Therefore, when the plurality of filling grooves 52 are filled with the conductive ink 61 in the state that the wiring substrate 41 makes contact with the piezoelectric layer 140, it becomes easy for the air inside the plurality of filling grooves 52 to move from the atmosphere communication passage 58 to the outside. Accordingly, it becomes easier to fill the plurality of filling grooves 52 throughout with the conductive ink 61. Further, as shown in FIGS. 13A and 13B, the plurality of filling grooves 52 extend from the communication portion with the through hole 54 on the side of the supply groove 155 toward the communication portion with the atmosphere communication passage 58. Therefore, the conductive ink 61, which has flowed into the plurality of filling grooves 52 from the supply groove 155, flows toward the atmosphere communication passage 58. Hence, it becomes even easier for the air to move out of the filling grooves 52.

Next, explanations will be given about a few modifications which apply various changes to the first and second embodiments. Note that, however, the same reference numerals are used to refer to the components with identical or similar configurations to those of the above embodiments, any explanation for which will be omitted as appropriate.

Figure 8:
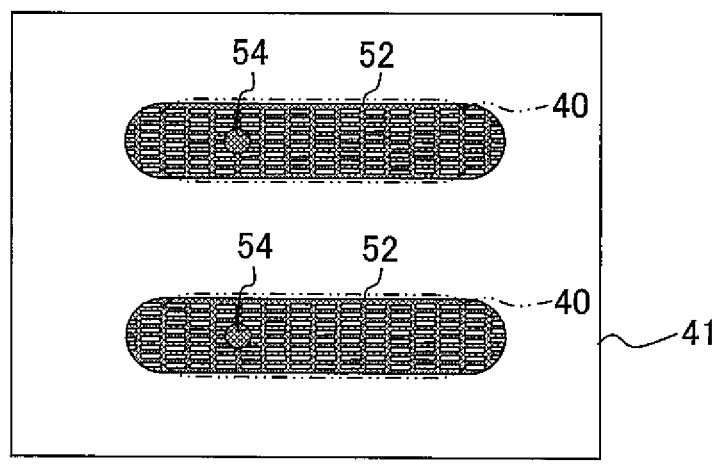
FIG. 8 is a partial enlarged bottom view of a wiring substrate according to a modification of the first embodiment.
Figure 16:
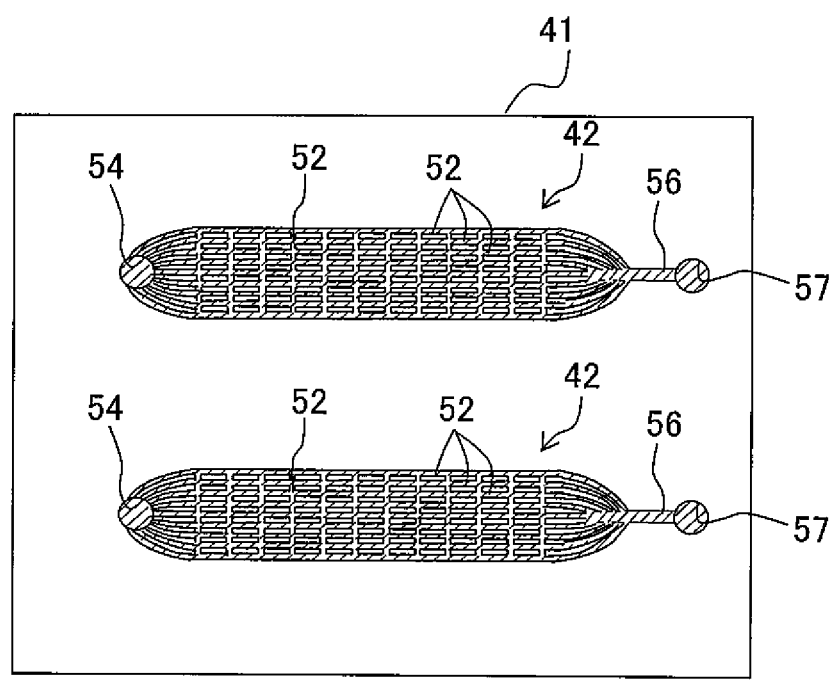
FIG. 16 is a partial enlarged bottom view of a wiring substrate according to a modification of the second embodiment.

The pattern of the filling grooves 52 for forming the first electrode 42 is not limited to the patterns of the first and second embodiments. For example, the plurality of filling grooves 52 may intersect each other to form a netlike pattern as shown in FIG. 8 or FIG. 16.

Further, in the first embodiment, a part of the area 53, at which the filling grooves 52 of the wiring substrate 41 are formed, extend out beyond the piezoelectric elements 40 in the longitudinal direction (see FIGS. 4 and 6B). However, the filling grooves 52 may alternatively extend out in the latitudinal direction of the piezoelectric elements 40. Further, the filling grooves 52 may also extend out through the entire circumference of the piezoelectric elements 40.

Figure 9:
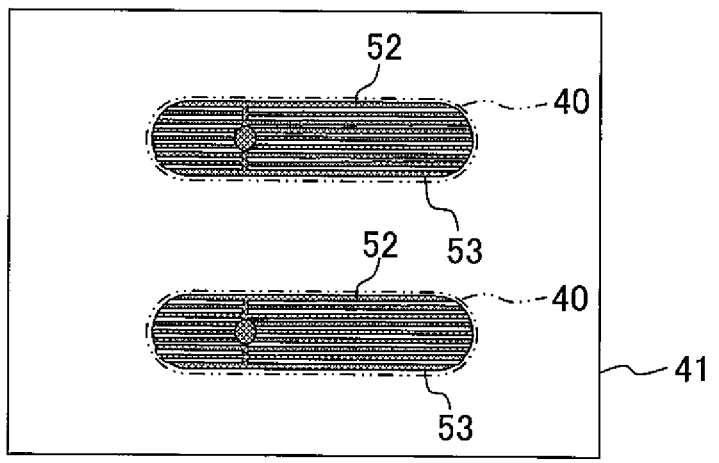
FIG. 9 is a partial enlarged bottom view of a wiring substrate according to another modification of the first embodiment.

Alternatively, as shown in FIG. 9, the size of the area 53, at which the filling grooves 52 of the wiring substrate 41 are formed, may be the same as or smaller than that of the piezoelectric elements 40, and thus the filling grooves 52 may not extend out from the piezoelectric elements 40. Even if the wiring substrate 41 is in contact with each of the piezoelectric elements 40, there is still some interspace between the wiring substrate 41 and each of the piezoelectric elements 40. Therefore, even if the filling grooves 52 do not extend out from the piezoelectric elements 40, it is still possible to drain the air inside the filling grooves 52 to the outside along with the filling of the conductive ink 61. Further, with such a configuration as shown in FIG. 9, because the filling grooves 52 do not extend out from the piezoelectric elements 40, differing from the configuration of the first embodiment, there is no occurrence of the problem that the conductive ink filling the filling grooves 52 drips down.

Figure 10:
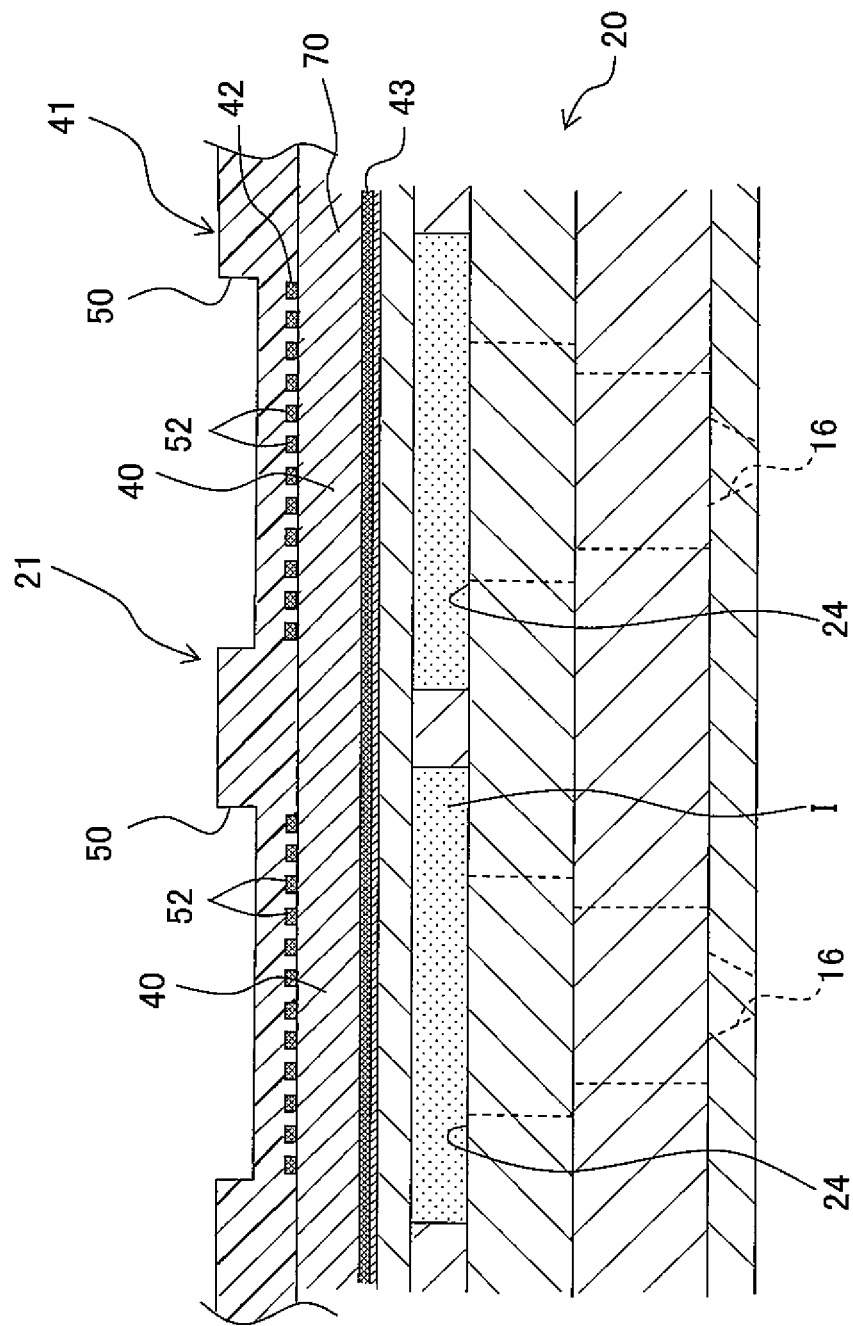
FIG. 10 is a cross-sectional view of an ink-jet head according to still another modification of the first embodiment.

In the first embodiment, as shown in FIG. 5, the plurality of piezoelectric elements 40 corresponding to the plurality of pressure chambers 24 respectively are separated from each other. In contrast to this, as shown in FIG. 10, the piezoelectric actuator 21 may alternatively be configured to have a piezoelectric layer 70 arranged in a planar manner over the plurality of pressure chambers 24 so that the plurality of piezoelectric elements 40 corresponding to the plurality of pressure chambers 24 are integrated into one body.

It is also possible to appropriately change the configuration of the supply grooves 55, 155 of the first and second embodiments for filling the filling grooves 52 with the conductive ink 61. For example, it is possible to appropriately change the position and shape of the liquid receiving portions 55d, 155b on which the conductive ink 61 jetted from the ink jet head 60 is landed. Further, if the second supply groove 55b has a sufficiently large groove width to such an extent as is able to land the conductive ink 61 jetted from the ink jet head 60, it is also possible to omit the liquid receiving portions 55d. Further, it is not necessary to form the supply grooves 55, 155 on the surface of the wiring substrate 41 on the side opposite to the joint surface with the piezoelectric elements 40, but it is possible to appropriately determine the arrangement of the supply grooves 55, 155 according to how the wires 47 are laid out from the first electrodes 42. For example, even if the supply grooves 55, 155 are formed on the joint surface of the wiring substrate 41, it is sufficiently possible to jet the conductive ink 61 from the inkjet head 60 into the supply grooves 55, 155 so that the conductive ink 61 jetted from the ink jet head 60 does not land on the piezoelectric elements 40, by forming the supply grooves 55, 155 to extend to a position sufficiently away from the piezoelectric elements 40.

The method for filling the filling grooves 52 with the liquid conductive material is not limited to the method by jetting the conductive ink 61 from the inkjet head 60. For example, it is also possible to adopt a method of injecting a predetermined quantity of the liquid conductive material with a dispenser provided with a needle for liquid injection.

In the first and second embodiments, the wiring substrate 41 and the piezoelectric elements 40 (piezoelectric layer 140) are joined together by hardening the conductive ink having filled the filling grooves 52. However, the wiring substrate 41 and the piezoelectric elements 40 (piezoelectric layer 140) may also be joined together by another process different from that of filling with the conductive ink (forming the first electrodes), for example, by using another adhesive different from the conductive ink.

In the first and second embodiments, in a state that the wiring substrate 41 makes contact with the piezoelectric elements 40 (piezoelectric layer 140), the filling grooves 52, which are closed up by the piezoelectric elements 40, are filled with the liquid conductive material (conductive ink). However, the filling grooves 52 of the wiring substrate 41 may be filled with the liquid conductive material and the conductive material may be hardened to form the first electrodes 42 on the wiring substrate 41, and then, the wiring substrate 41 may be joined to the piezoelectric elements 40 while making the first electrodes 42 contact with the piezoelectric elements 40.

Although the plurality of filling grooves 52 are formed on the joint surface of the wiring substrate 41 in the first and second embodiments, the plurality of filling grooves 52 may alternatively be formed on the upper surface of each of the piezoelectric elements 40 to be joined to the wiring substrate 41, and then the plurality of filling grooves 52 may be filled with the liquid conductive material to form the first electrodes 42.

The first electrodes 42 are not limited to being formed by filling the filling grooves 52 formed in the wiring substrate 41 (or in the piezoelectric elements 40) with the liquid conductive material as described above. For example, each of the first electrodes 42 may be formed on the joint surface of one of the wiring substrate 41 and the corresponding piezoelectric element 40 by a publicly known method such as screen printing, sputtering or the like, and then the joint surface is joined to, while letting each of the first electrodes 42 contact with, the other of the wiring substrate 41 and the corresponding piezoelectric element 40. In this modification, the first electrodes 42 are also arranged between the wiring substrate 41 and each of the piezoelectric elements 40 being in contact with the wiring substrate 41 and each of the piezoelectric elements 40, and this simplifies the configuration of connecting the both. Further, because it is not necessary to form electrodes on both the wiring substrate 41 and the piezoelectric elements 40, the production process can also be simplified.

Figure 17:
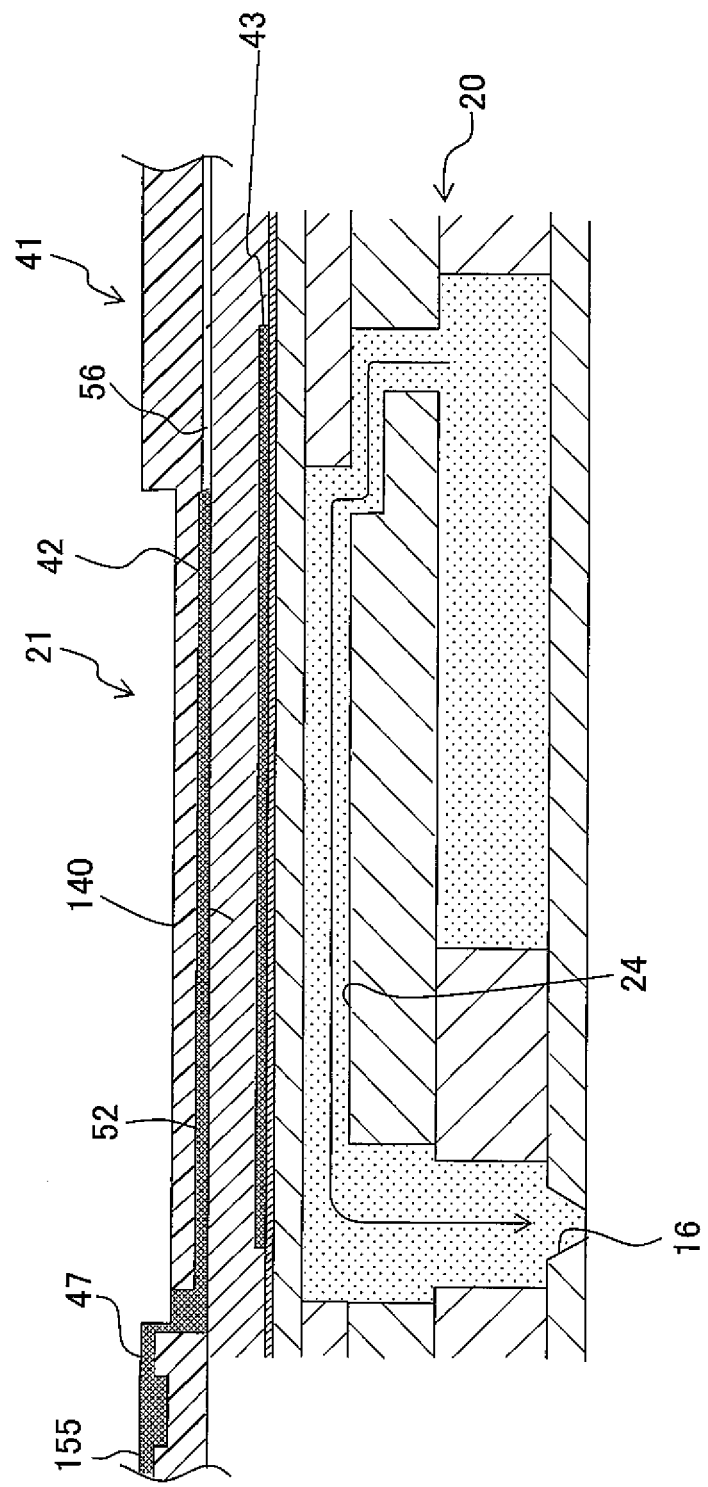
FIG. 17 is a cross-sectional view of an ink-jet head according to another modification of the second embodiment.

The atmosphere communication passage 58 in communication with the plurality of filling grooves 52 is not limited to the configuration of the second embodiment. For example, the atmosphere communication passage 58 does not need to open at the upper surface of the wiring substrate 41 (the surface on the side opposite to the joint surface). As shown in FIG. 17, instead of the atmosphere communication hole 57 opening to the upper surface of the wiring substrate 41, the atmosphere communication groove 56 connected to the plurality of filling grooves 52 may extend to the end (edge) of the wiring substrate 41 along the lower surface of the wiring substrate 41, and open at the end (edge).

Figure 18:
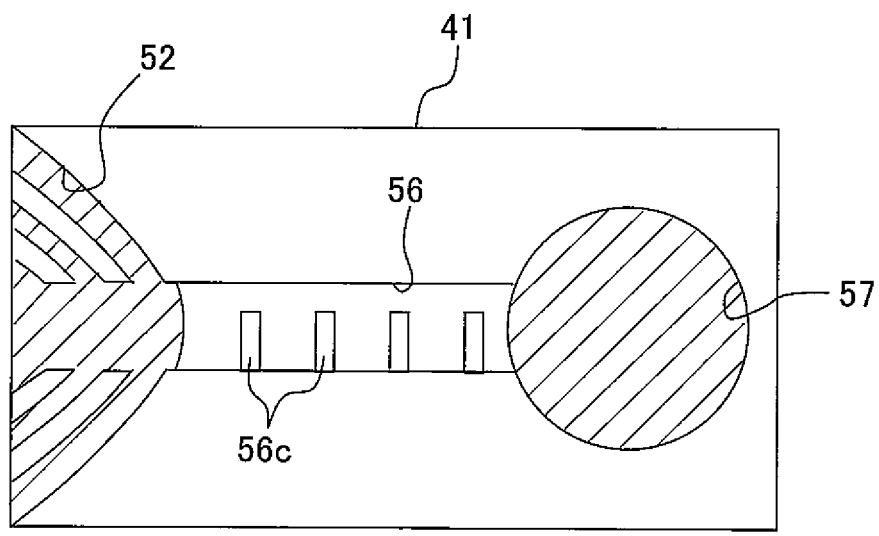
FIG. 18 is an enlarged view of an atmosphere communication groove according to still another modification of the second embodiment.

While the atmosphere communication passage 58 (the atmosphere communication grooves 56) of the second embodiment preferably has a high fluid-flow resistance such that the liquid conductive material filling the plurality of filling grooves 52 may not flow out, they are not limited to the shape and the like shown in FIG. 14. As shown in FIG. 18 for example, it is also possible to form each of the atmosphere communication passages 58 with a plurality of ribs 56c projecting only from one lateral side of the atmosphere communication groove 56. Further, without any ribs, it is still possible to increase the fluid-flow resistance in the atmosphere communication grooves 56 by some other technique such as narrowing the groove width, increasing the length, forming a serpentine shape and increasing the number of curved portions, or the like.

While each of the embodiments and modifications explained above is an example of applying the present invention to an ink jet head which is a liquid jetting apparatus, the piezoelectric actuator of the present invention is not limited to being used for the purpose of applying pressure to a liquid. For example, it may also be used for the purpose of causing a solid matter to undergo displacement, vibration, etc.

What is claimed is:

1. A liquid jetting apparatus for jetting a liquid, the apparatus comprising:
a channel unit in which a liquid channel including a nozzle for jetting the liquid is formed; and
a piezoelectric actuator which is provided on the channel unit and which applies jetting energy to the liquid inside the liquid channel;
wherein the piezoelectric actuator comprises:
a piezoelectric element; and
a wiring substrate in which a first electrode and a wire electrically connected to the first electrode are formed and which is joined to one surface of the piezoelectric element;
wherein the first electrode makes contact with the piezoelectric element;
wherein a portion, of the wiring substrate, at which the first electrode is formed is thinner than any portion, of the wiring substrate, different from the portion at which the first electrode is formed; and
wherein the wiring substrate includes:
an atmosphere communication passage; and
a communication portion communicated with the atmosphere communication passage.

2. A liquid jetting apparatus for jetting a liquid, the apparatus comprising:
a channel unit in which a liquid channel including a nozzle for jetting the liquid is formed; and
a piezoelectric actuator which is provided on the channel unit and which applies jetting energy to the liquid inside the liquid channel;
wherein the piezoelectric actuator comprises:
a piezoelectric element; and
a wiring substrate in which a first electrode and a wire electrically connected to the first electrode are formed and which is joined to one surface of the piezoelectric element;
wherein the first electrode makes contact with the piezoelectric element; and
wherein the wiring substrate includes:
an atmosphere communication passage; and
a communication portion communicated with the atmosphere communication passage.

3. The liquid jetting apparatus according to claim 2;
wherein a plurality of first grooves as the communication portion are formed on a joint surface of the wiring substrate with respect to the piezoelectric element, and the first electrode is formed by a conductive material filled in the first grooves.

4. The liquid jetting apparatus according to claim 3;
wherein at least under a condition that the first grooves are filled with the conductive material, the first grooves communicate with the atmosphere through the atmosphere communication passage in a state that the wiring substrate makes contact with the piezoelectric element.

5. The liquid jetting apparatus according to claim 4;
wherein in the atmosphere communication passage, a plurality of ribs are arranged along a length direction of the atmosphere communication passage.

6. The liquid jetting apparatus according to claim 4;
wherein the piezoelectric actuator further comprises a second electrode arranged on a surface of the piezoelectric element opposite to the one surface so as to sandwich the piezoelectric element between the second electrode and the first electrode;
wherein a pullout electrode is provided on the one surface of the piezoelectric element to be electrically conducted to the second electrode;
wherein the atmosphere communication passage of the wiring substrate includes an atmosphere communication groove which is formed on the joint surface with respect to the piezoelectric element and which is connected to the first grooves, and an atmosphere communication hole which penetrates through the wiring substrate in a thickness direction of the wiring substrate and which is communicated with the atmosphere communication groove; and
wherein the conductive material filled in the atmosphere communication hole is electrically conducted to the pullout electrode.

7. A liquid jetting apparatus for jetting a liquid, the apparatus comprising:
a channel unit in which a liquid channel including a nozzle for jetting the liquid is formed; and
a piezoelectric actuator which is provided on the channel unit and which applies jetting energy to the liquid inside the liquid channel;
wherein the piezoelectric actuator comprises:
a piezoelectric element; and
a wiring substrate in which a first electrode and a wire electrically connected to the first electrode are formed and which is joined to one surface of the piezoelectric element;
wherein the first electrode makes contact with the piezoelectric element;
wherein a plurality of first grooves are formed on a joint surface of the wiring substrate with respect to the piezoelectric element, and the first electrode is formed by a conductive material filled in the first grooves;
wherein on a surface of the wiring substrate opposite to the joint surface with respect to the piezoelectric element, a second groove which has a width greater than that of each of the first grooves is formed;

wherein the second groove is communicated with the first grooves via a through hole penetrating through the wiring substrate in a thickness direction of the wiring substrate;

wherein the first electrode is formed on the joint surface of the wiring substrate by the conductive material filled in the first grooves from the second groove via the through hole; and wherein the wire electrically connected to the first electrode is formed on the surface of the wiring substrate opposite to the joint surface.

8. The liquid jetting apparatus according to claim 7, wherein in the wiring substrate, a portion of an area, on which the first grooves are formed, extends out from the piezoelectric element and is not joined to the piezoelectric element.

9. The liquid jetting apparatus according to claim 8; wherein the first grooves extend from a communication portion communicated with the through hole toward the portion extending out from the piezoelectric element.

10. The liquid jetting apparatus according to claim 8; wherein the channel unit has a conductivity at least at a portion on which the piezoelectric element is arranged, and has an insulation film formed in an area facing the portion of the wiring substrate at which the first grooves extend out from the piezoelectric element.

11. The liquid jetting apparatus according to claim 9; wherein the piezoelectric actuator further comprises a second electrode arranged on a surface of the piezoelectric element opposite to the one surface so that the piezoelectric element is sandwiched between the first electrode and the second electrode;

wherein the second electrode is shorter than the piezoelectric element with respect to an extending direction of the first grooves; and wherein the second electrode is not exposed to outside of the piezoelectric element at least lateral sides of the piezoelectric element with respect to a direction in which the first grooves extend.

12. A piezoelectric actuator comprising:
a piezoelectric element; and
a wiring substrate in which a first electrode and a wire electrically connected to the first electrode are formed and which is joined to one surface of the piezoelectric element;
wherein the first electrode makes contact with the piezoelectric element;
wherein the wiring substrate is thinned at a portion at which the first electrode is formed; and
wherein the wiring substrate includes:
    an atmosphere communication passage; and
    a communication portion communicated with the atmosphere communication passage.

13. A method for producing a liquid jetting apparatus including: a channel unit in which a liquid channel including a nozzle for jetting the liquid is formed; and a piezoelectric actuator which includes a piezoelectric element and a wiring substrate joined to one surface of the piezoelectric element, and which is provided on the channel unit to apply jetting energy to the liquid inside the liquid channel; the method comprising:
a groove formation step for forming a plurality of first grooves on a joint surface of the wiring substrate with respect to the piezoelectric element; and
an electrode formation step for forming a first electrode on the joint surface and joining the joint surface of the wiring substrate to the piezoelectric element by filling the first grooves with a liquid conductive material;
wherein the wiring substrate includes:
    an atmosphere communication passage; and
    a communication portion communicated with the atmosphere communication passage.

14. The method according to claim 13;
wherein in the electrode formation step, the first grooves are filled with the conductive material in a state that the joint surface of the wiring substrate on which the first grooves are formed makes contact with the one surface of the piezoelectric element.

15. The method according to claim 14, further comprising:
an atmosphere communication passage formation step for forming an atmosphere communication passage, in the wiring substrate, for communicating the first grooves with the atmosphere in a state that the wiring substrate makes contact with the piezoelectric element.

16. The method according to claim 14;
wherein the conductive material is a conductive ink containing a thermosetting resin; and
wherein the electrode formation step further includes heating the conductive material filled in the first grooves.

17. The method according to claim 13;
wherein in the groove formation step, a second groove which communicates with the first grooves is formed on a surface of the wiring substrate opposite to the joint surface; and
wherein in the electrode formation step, a conductive ink is jetted into the second groove by an ink-jet head and the first grooves are filled with the conductive ink from the second groove.

18. The method according to claim 14;
wherein in the electrode formation step, the wiring substrate makes contact with the one surface of the piezoelectric element such that a part of an area, of the wiring substrate, on which the plurality of first grooves are formed extend out from the one surface of the piezoelectric element.

19. The method according to claim 17;
wherein in the electrode formation step, the conductive ink is jetted from the ink-jet head toward an end portion, of the second groove, at which the second groove communicate with the first grooves.

20. A piezoelectric actuator comprising:
a piezoelectric element; and
a wiring substrate in which a first electrode and a wire electrically connected to the first electrode are formed and which is joined to one surface of the piezoelectric element;
wherein the first electrode makes contact with the piezoelectric element; and
wherein the wiring substrate includes:
    an atmosphere communication passage; and
    a communication portion communicated with the atmosphere communication passage.

21. The piezoelectric actuator according to claim 20;
wherein a plurality of first grooves as the communication portion are formed on a joint surface of the wiring substrate with respect to the piezoelectric element;
wherein the first grooves communicate with the atmosphere through the atmosphere communication passage in a state that the wiring substrate makes contact with the piezoelectric element; and wherein the first electrode is formed by a conductive material filled in the first grooves.

* * * * *